(12) United States Patent
Ishii et al.

(10) Patent No.: US 7,642,517 B2
(45) Date of Patent: Jan. 5, 2010

(54) RADIATION IMAGING APPARATUS AND RADIATION IMAGING SYSTEM

(75) Inventors: Takamasa Ishii, Honjo (JP); Chiori Mochizuki, Sagamihara (JP); Minoru Watanabe, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/210,839

(22) Filed: Sep. 15, 2008

(65) Prior Publication Data
US 2009/0008533 A1 Jan. 8, 2009

Related U.S. Application Data

(63) Continuation of application No. 11/751,702, filed on May 22, 2007, now Pat. No. 7,470,908.

(30) Foreign Application Priority Data

May 24, 2006 (JP) ............................. 2006-144683
Apr. 5, 2007 (JP) ............................. 2007-099751

(51) Int. Cl.
*G01T 1/24* (2006.01)
*H01L 25/065* (2006.01)

(52) U.S. Cl. ................................. 250/370.08

(58) Field of Classification Search ............ 250/370.01, 250/370.02, 370.03, 370.04, 370.05, 370.06, 250/370.07, 370.08, 370.09, 370.1, 370.11, 250/370.12, 370.13, 370.14, 370.15
See application file for complete search history.

(56) References Cited

U.S. PATENT DOCUMENTS

| | | | | |
|---|---|---|---|---|
| 5,648,674 | A | 7/1997 | Weisfield et al. | 257/248 |
| 5,801,385 | A | 9/1998 | Endo et al. | 250/370.11 |
| 6,021,173 | A | 2/2000 | Brauers et al. | 378/98.8 |
| 6,060,714 | A | 5/2000 | Zhong et al. | 250/370.09 |
| 7,009,164 | B2 | 3/2006 | Kobayashi et al. | 250/208.1 |
| 7,126,128 | B2 | 10/2006 | Ikeda et al. | 250/370.09 |
| 7,164,115 | B2 | 1/2007 | Yagi | 250/214.1 |
| 7,205,547 | B2 | 4/2007 | Ishii et al. | 250/370.9 |
| 7,205,568 | B2 | 4/2007 | Watanabe et al. | 257/59 |
| RE39,780 | E | 8/2007 | Kaifu et al. | 257/53 |
| 7,315,028 | B2 | 1/2008 | Mochizuki | 250/370.11 |
| 2002/0024016 | A1 | 2/2002 | Endo | 250/370.11 |
| 2004/0179649 | A1 | 9/2004 | Yagi | 378/97 |
| 2005/0274991 | A1 | 12/2005 | Ishii et al. | 257/232 |
| 2006/0062352 | A1 | 3/2006 | Nomura et al. | 378/98.8 |
| 2006/0065944 | A1 | 3/2006 | Mochizuki et al. | 257/444 |
| 2006/0249763 | A1 | 11/2006 | Mochizuki et al. | 257/291 |
| 2007/0069107 | A1 | 3/2007 | Ishii et al. | 250/208.1 |
| 2007/0075253 | A1 | 4/2007 | Misawa et al. | 250/370.11 |
| 2007/0145285 | A1 | 6/2007 | Ishii et al. | 250/370.11 |
| 2007/0146520 | A1 | 6/2007 | Watanabe et al. | 348/308 |
| 2008/0128630 | A1 | 6/2008 | Nomura et al. | 250/370.09 |

FOREIGN PATENT DOCUMENTS

JP 2006-004998 1/2006

*Primary Examiner*—David P Porta
*Assistant Examiner*—David S Baker
(74) *Attorney, Agent, or Firm*—Fitzpatrick, Cella, Harper & Scinto

(57) ABSTRACT

A radiation imaging apparatus has a pixel region arranged on a substrate. Arranged in a matrix pattern in the pixel region are pixels, each pixel including a conversion element which converts radiation to electrical charges, and a switching element which is connected to the conversion element therein. The radiation imaging apparatus has, in a region outside the pixel region of the substrate, an intersection at which a signal line connected to the switching element and a bias line connected to the conversion element intersects. At the intersection, a semiconductor layer is arranged between the signal line and the bias line, and a carrier blocking portion is arranged between the semiconductor layer and the signal line.

14 Claims, 23 Drawing Sheets

F I G. 15
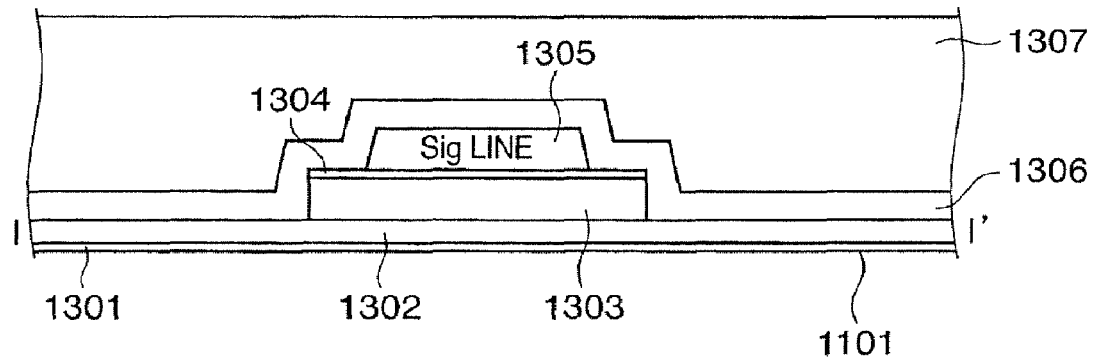

DEPLETED STATE

CONDUCTIVE STATE

DEPLETED STATE

CONDUCTIVE STATE

DEPLETED STATE

RADIATION IMAGING APPARATUS AND RADIATION IMAGING SYSTEM

RELATED APPLICATIONS

This application is a continuation of application Ser. No. 11/751,702, filed May 22, 2007, and claims benefit of the filing date of that application under 35 U.S.C. § 120, and also claims benefit under 35 U.S.C. § 119 of Japanese Patent Applications Nos. 2006-144683, filed May 24, 2006, and 2007-099751, filed Apr. 5, 2007. The entire disclosure of each of the three mentioned prior applications is hereby incorporated herein by reference.

BACKGROUND OF THE INVENTION

1. Field of the Invention

The present invention relates to a radiation imaging apparatus using radiation and a radiation imaging system.

2. Description of the Related Art

Recently, there have been advances in manufacturing techniques of liquid crystal display panels that use switching elements such as thin-film transistors (TFTs). There is a trend towards enlargement of panels and display units. These manufacturing techniques have been applied to large area sensors having conversion elements such as semiconductor conversion elements and switching elements. This has led to the full digitalization of such fields as the radiation imaging apparatus field (see Japanese Patent Laid-Open No. 2006-4998).

Conversion elements used in radiation imaging apparatuses can be divided into direct and indirect types. A direct conversion element directly converts radiation into electric charges. An indirect conversion element carries out radiation-to-electric charges conversion of radiation such as visible light that has undergone wavelength conversion using a wavelength conversion device such as a scintillator. Examples of direct conversion elements include amorphous selenium, gallium arsenide, gallium phosphate, lead iodide, mercury iodide, CdTe, and CdZnTe. Examples of indirect types include MIS conversion elements and PIN conversion elements. When converting visible light into electric charges, it is common for an amorphous silicon (a-Si) layer to be used as the conversion element.

At the same time, because the radiation imaging apparatus outputs images by digitally converting minute signals, there may be deterioration of the S/N ratio of a captured image if there is even a small amount of noise in the minute signals. In particular, because a bias line connected to a conversion element and a signal line connected to a switching element are prone to becoming noise sources, countermeasures against these kinds of lines had been sought in order to reduce noise.

As a result of dedicated research in noise arising from bias lines and signal lines, the present inventors discovered that noise may be generated if these lines were placed in a specific alignment structure.

SUMMARY OF THE INVENTION

The present invention has been made based on the above findings, and has as its object to suppress noise generated by bias and signal lines.

A first aspect of the present invention relates to a radiation imaging apparatus which has a pixel region arranged on a substrate. Arranged in a matrix pattern in the pixel region are pixels, each pixel having a conversion element which converts radiation into electric charges, and a switching element connected to the conversion element therein. The first aspect also has, outside of the pixel region of the substrate, intersections, each of which is formed by the crossing over of a first line connected to the switching elements and a second line connected to the conversion elements. At each intersection, there is a semiconductor layer arranged between the first line and the second line, and a carrier blocking portion between the semiconductor layer and the first line.

A second aspect of the present invention is related to a radiation imaging system, and includes the radiation imaging apparatus and a signal-processing unit which processes signals from the radiation imaging apparatus.

Further features of the present invention will become apparent from the following description of exemplary embodiments with reference to the attached drawings.

BRIEF DESCRIPTION OF THE DRAWINGS

FIG. 15 is a sectional view of FIG. 12 I-I' showing the problems of the radiation imaging apparatus.

DESCRIPTION OF THE EMBODIMENTS

The preferred embodiments of the present invention will be described below with reference to the drawings. First, FIG. 11 through FIG. 16C, FIG. 18A and FIG. 18B will be referenced to describe the noise generation mechanism discovered by the present inventors. Next, FIG. 1 through FIG. 10, FIG. 17A, FIG. 17B, FIG. 19A and FIG. 19B will be referenced to describe the preferred embodiments of the present invention. In addition, according to the present specification, types of radiation include electromagnetic waves such as visible light and X-, α-, β-, and γ-rays.

Figure 11:
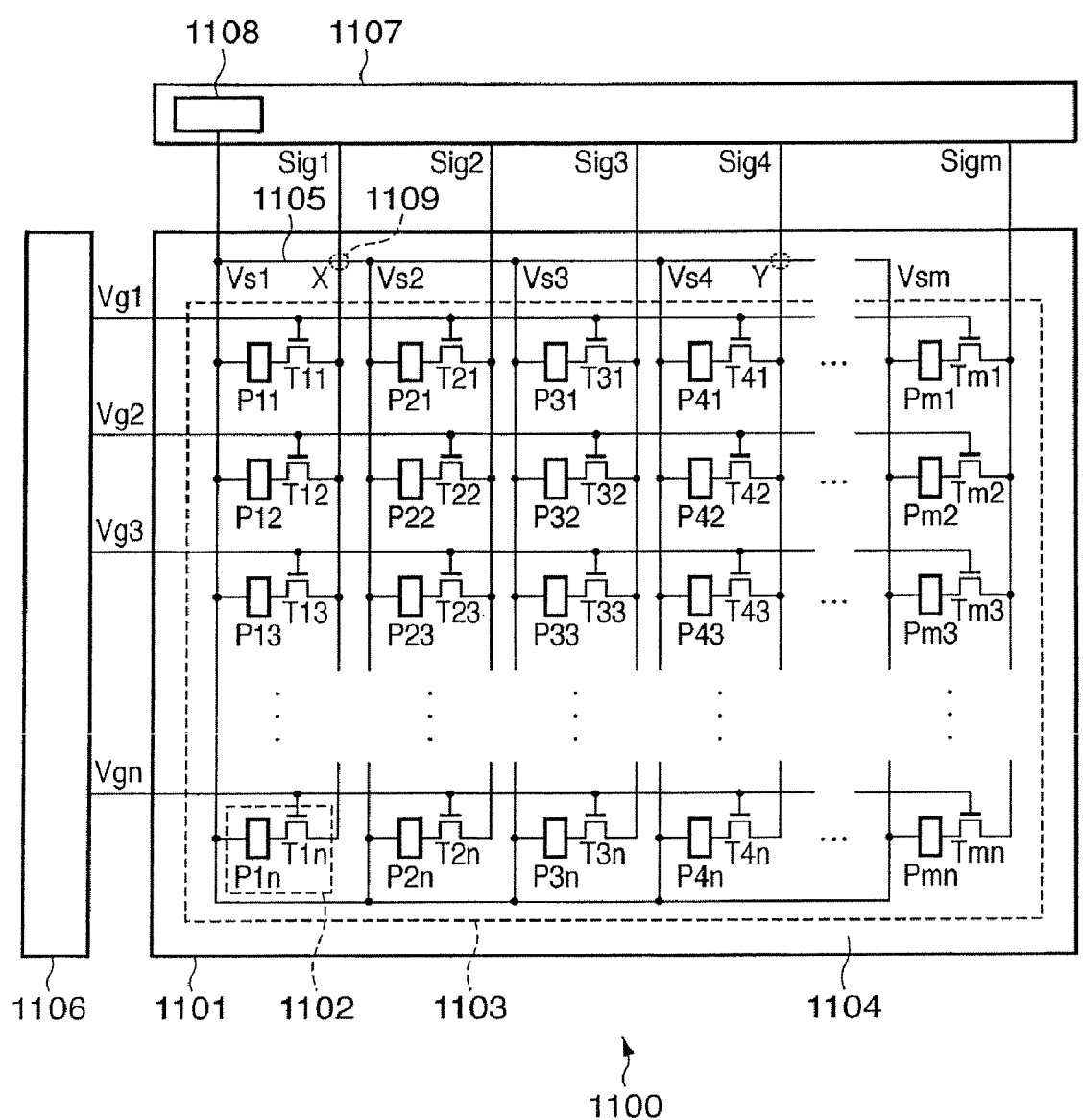
FIG. 11 is an equivalent circuit diagram showing the radiation imaging apparatus.
Figure 12:
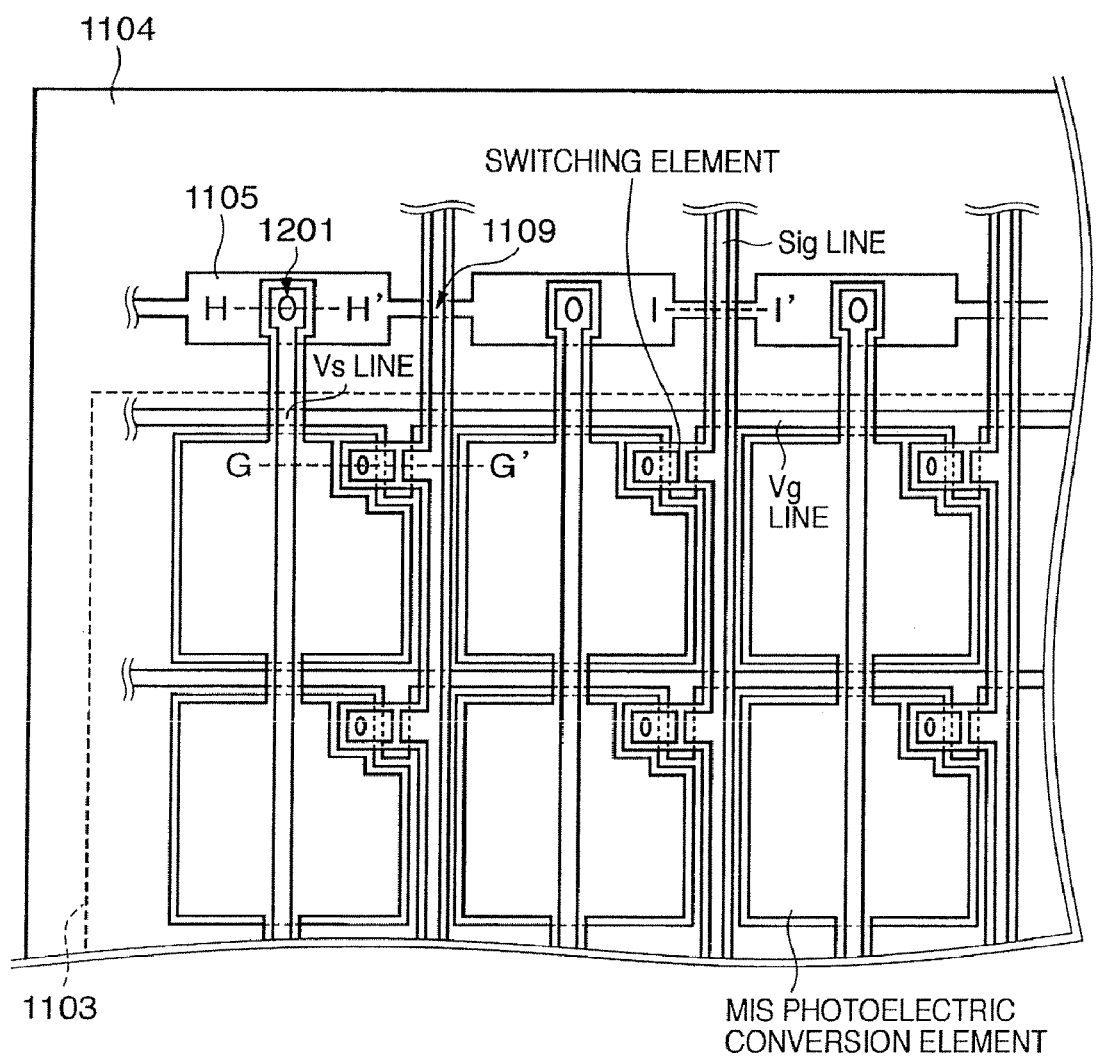
FIG. 12 is a plan view showing the problems of the radiation imaging apparatus.

FIG. 11 is an equivalent circuit diagram of a conventional radiation imaging apparatus 1100. FIG. 12 is a layout diagram of the radiation imaging apparatus 1100 expected from the equivalent circuit diagram of FIG. 11. As shown in FIG. 11, the radiation imaging apparatus 1100 has an insulating substrate 1101 and pixels 1102 of m columns and n rows (where m and n are integers of greater than or equal to 1) arranged on the insulating substrate 1101. Each of the pixels 1102 comprises the MIS photoelectric conversion element Pmn, which functions as a conversion element which converts radiation into electric charges, and a switching element Tmn for signal transfer connected to the MIS photoelectric conversion element Pmn. The pixel number is not limited to any specific number, but 2000×2000 pixels may be arranged on the insulating substrate.

Vsm is a common bias line ("Vs line" below) for providing bias to the MIS photoelectric conversion element Pmn. Sigm is a signal line ("Sig line" below) for reading out electric charges which have undergone photoelectric conversion by the MIS photoelectric conversion element Pmn. Vg1 through Vgn are gate lines ("Vg lines" below) which control the ON/OFF of the switching element Tmn.

The insulating substrate 1101 is divided into a pixel region 1103 in which the pixels 1102 are arranged in a matrix pattern, and a peripheral region 1104 located outside the external sides of the pixel region 1103. In the peripheral region 1104, there is arranged a Vs connection line 1105 connected to the Vs line. In addition, in the peripheral region 1104, there is an intersection 1109 at which the Vs connection line 1105 and the Sig line intersects. Described below are the principles of operation of the radiation imaging apparatus 1100.

Figure 16A:
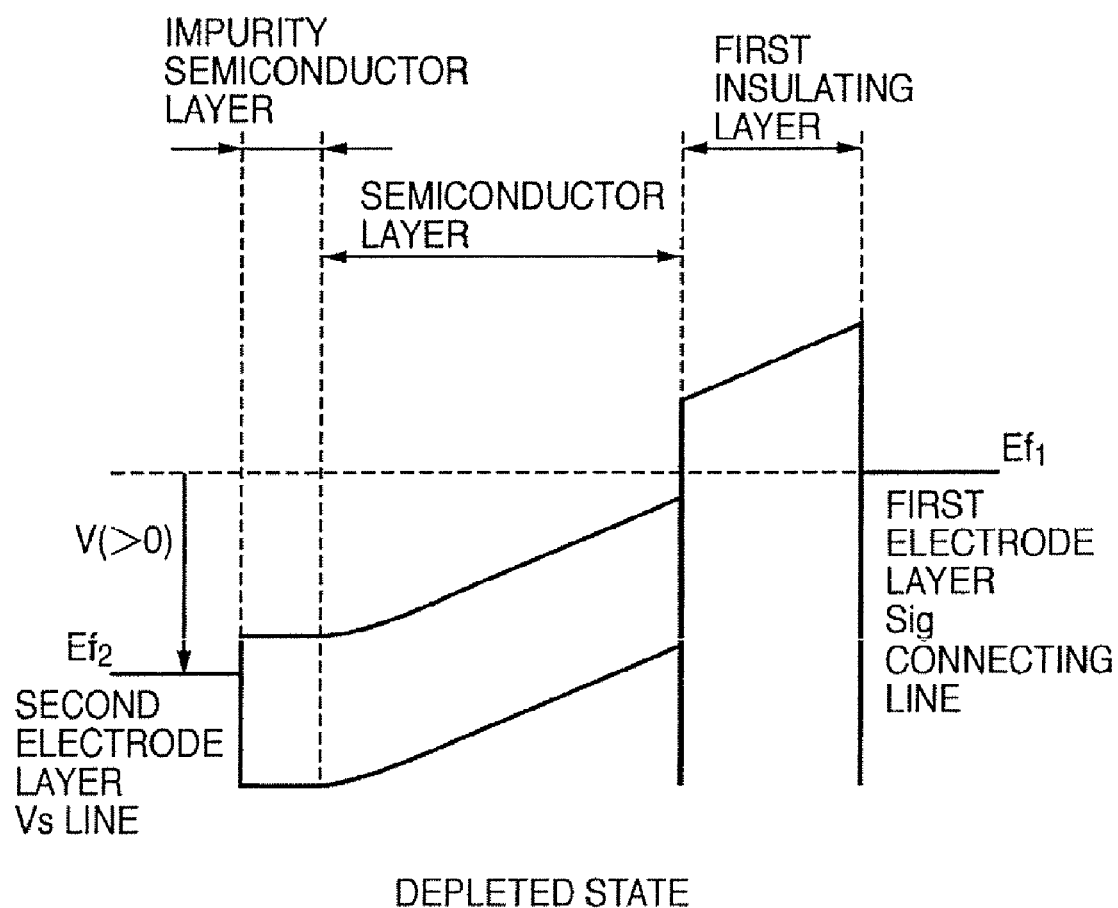
FIG. 16A is an energy band diagram showing the depletion state of the radiation imaging apparatus.
Figure 16B:
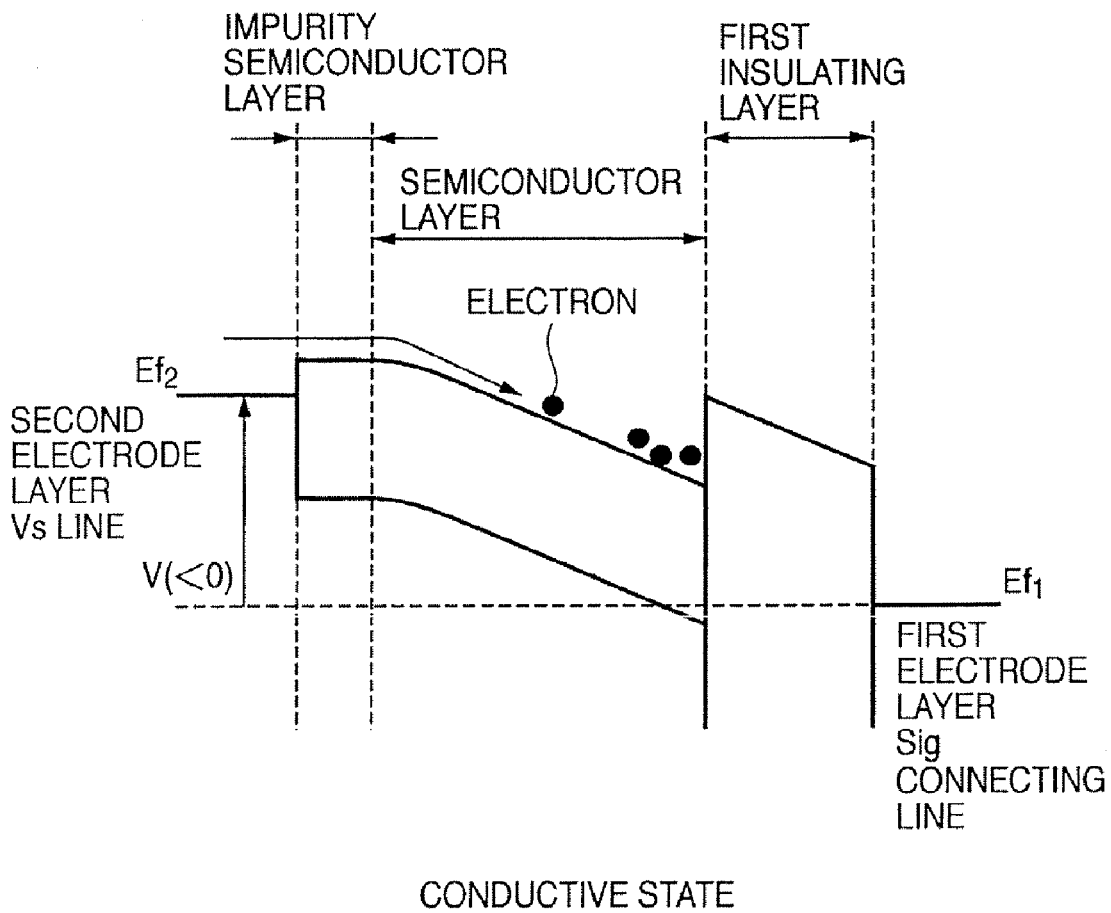
FIG. 16B is an energy band diagram showing the conductive state of the radiation imaging apparatus.

First, bias is provided to the Vs line so that the photoelectric conversion layer of the MIS photoelectric conversion element Pmn arranged in the pixel region 1103 is depleted. For example, the reference potential (GND) is provided to the Sig line, and a voltage (e.g., 10V) higher than the reference potential is provided to the Vs line. In this state, radiation exposed to a subject is transmitted through while being subject to decay by the subject. Radiation which has been transmitted through the subject is converted into visible light in a scintillator layer. This visible light is incident on the MIS photoelectric conversion element Pmn and undergoes photoelectric conversion to electric charges. These electric charges are transferred to the Sig line via the switching element Tmn, by a gate driving pulse applied to the Vg line from a gate driving apparatus 1106, and is read out externally by a readout apparatus 1107. Later, due to change in potential of the Vs line, the residual electric charges that were generated by the MIS photoelectric conversion element Pmn and not transferred are eliminated. The elimination of residual electric charges is performed, for example, as indicated in FIG. 16B, by changing the potential of the Vs line to a voltage (−5V) lower than the reference potential, and by injecting electrons from the Vs line into the semiconductor layer. Moreover, the elimination of residual electric charges can be performed by using the switching element Tmn connected to the MIS photoelectric conversion element Pmn. In the case of capturing moving images, the potential of the Vs line is returned to a voltage (e.g., 10V) higher than the reference potential, and the above operations are repeated.

Figure 13:
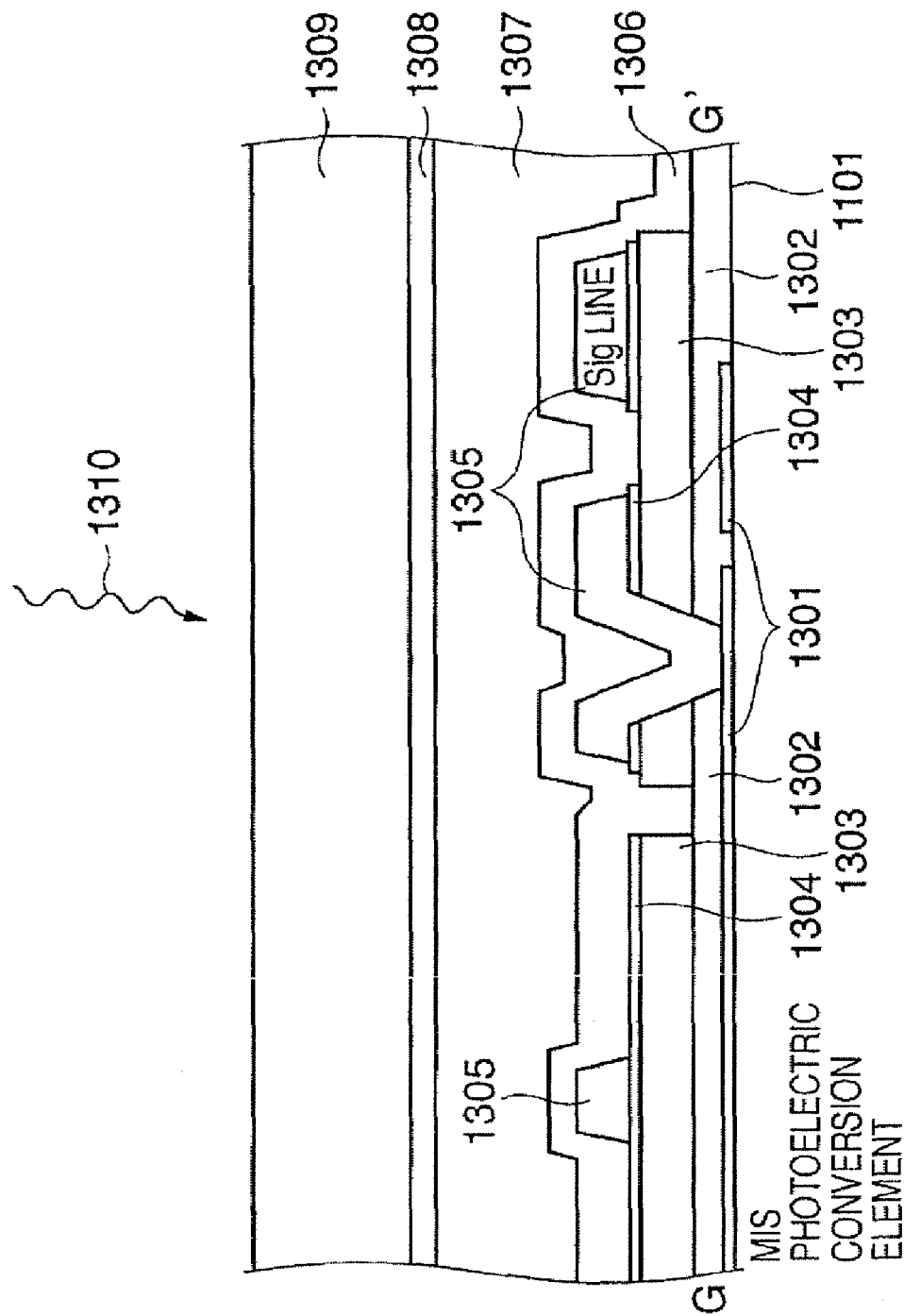
FIG. 13 is a sectional view of FIG. 12 G-G' showing the problems of the radiation imaging apparatus.
Figure 14:
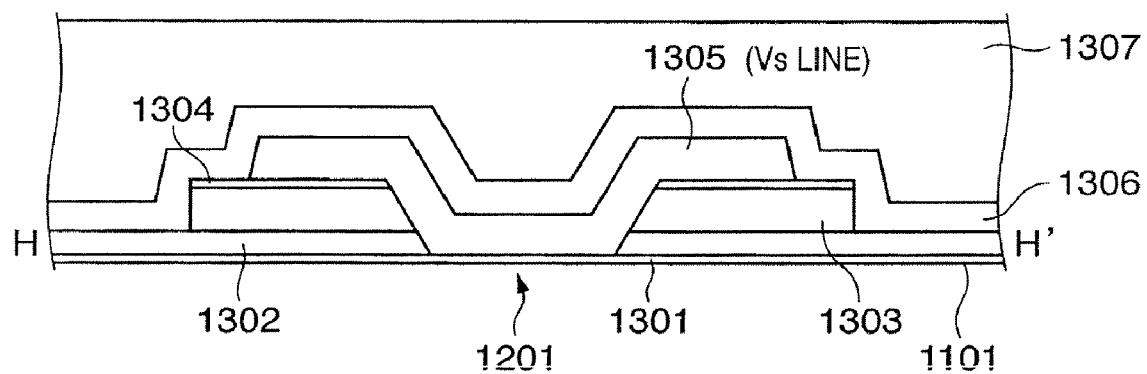
FIG. 14 is a sectional view of FIG. 12 H-H' showing the problems of the radiation imaging apparatus.

Next, FIG. 13 and FIG. 14 will be used to describe the layer structure of the radiation imaging apparatus 1100. FIG. 13 is a sectional view of the dashed line G-G' of one pixel shown in FIG. 12. FIG. 14 is a sectional view of the dashed line H-H' of the Vs connection hole 1201 shown in FIG. 12.

As shown in FIG. 13, the MIS photoelectric conversion element Pmn comprises a first electrode layer 1301, a first insulating layer 1302, a semiconductor layer 1303 (a-Si layer) which is a photoelectric conversion layer, an impurity semiconductor layer 1304, and a second electrode layer 1305 which forms the Vs line. The first electrode layer 1301 forms the gate electrode and the Vg line. The second electrode layer 1305 forms the source or drain electrode and the Sig line.

Further, in the upper layer of the MIS photoelectric conversion element Pmn and the switching element Tmn, there is successively formed a second insulating layer 1306, a protective layer 1307, an adhesive layer 1308, and a scintillator layer 1309 which performs wavelength conversion of a radiation 1310 into visible light. In this manner, by forming the MIS photoelectric conversion element Pmn and the switching element Tmn with the same layer, the manufacturing process is simplified.

Moreover, as shown in FIG. 14, each Vs line formed by the second electrode layer 1305 is connected, via the Vs connection hole 1201, to a Vs connection line 1105 formed by the first electrode layer 1301. Consequently, each Vs line is made common by the Vs connection line 1105.

Figure 18A:
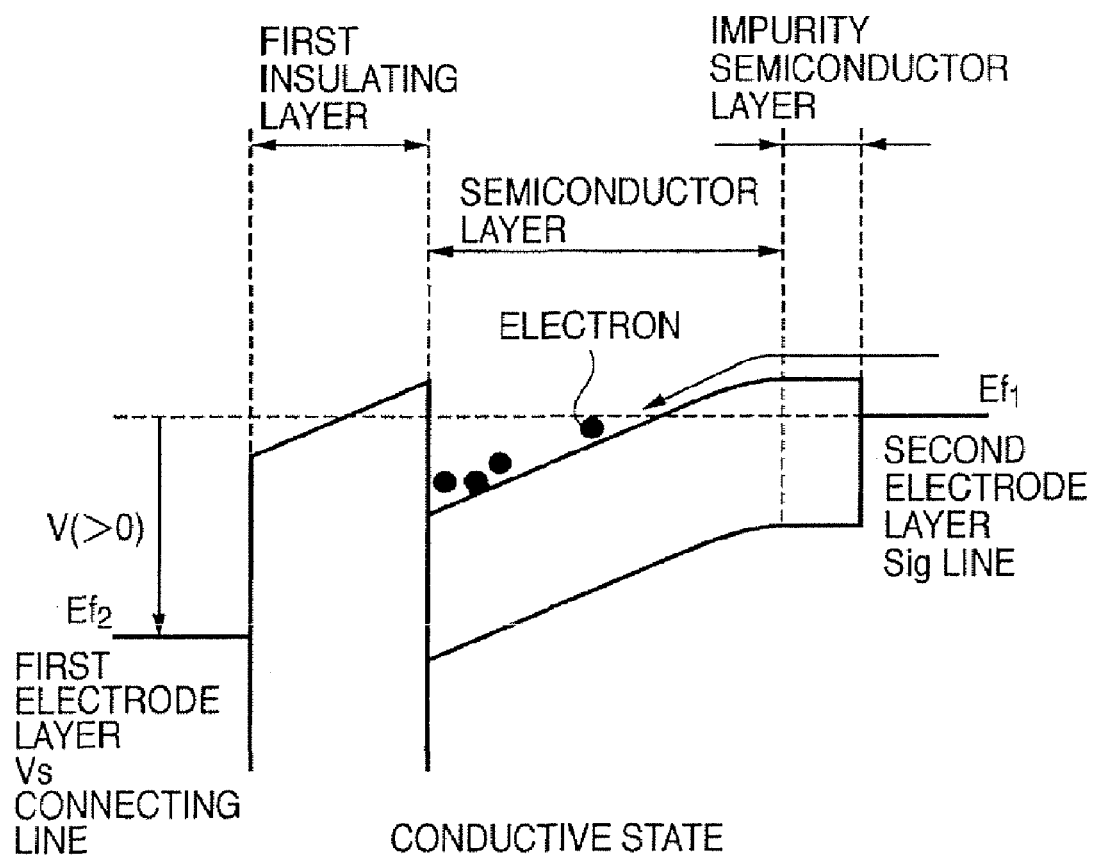
FIG. 18A is another energy band diagram showing the conductive state of the intersection of a conventional radiation imaging apparatus.

As shown in FIG. 11 and FIG. 12, in the peripheral region 1104 located around the pixel region 1103, the intersection 1109 is formed by the Vs connection line 1105 and the Sig line. FIG. 15 is a diagram showing one example of the structure of the intersection 1109. FIG. 15 is a sectional view of the dashed line I-I' shown in FIG. 12. Each Sig line formed by the second electrode layer 1305 intersects the Vs connection line 1105 (i.e., the Vs line) formed by the first electrode layer 1301 via the first insulating layer 1302, the semiconductor layer 1303, and the impurity insulating layer 1304. Consequently, the Vs line is formed by the first electrode layer 1301 at the intersection 1109. In this structure, when a bias is applied as described in the above description of operation principles, the semiconductor layer 1303 of the MIS photoelectric conversion element Pmn is put in a depletion state (i.e., as shown in FIG. 16A, a state in which carriers of the semiconductor layer are nearly non-existent.) By contrast, the semiconductor layer 1303 of the intersection 1109 is put in a conductive state as shown in FIG. 18A (i.e., as shown in FIG. 16B, a state in which carriers can be injected into the semiconductor layer.)

Figure 18B:
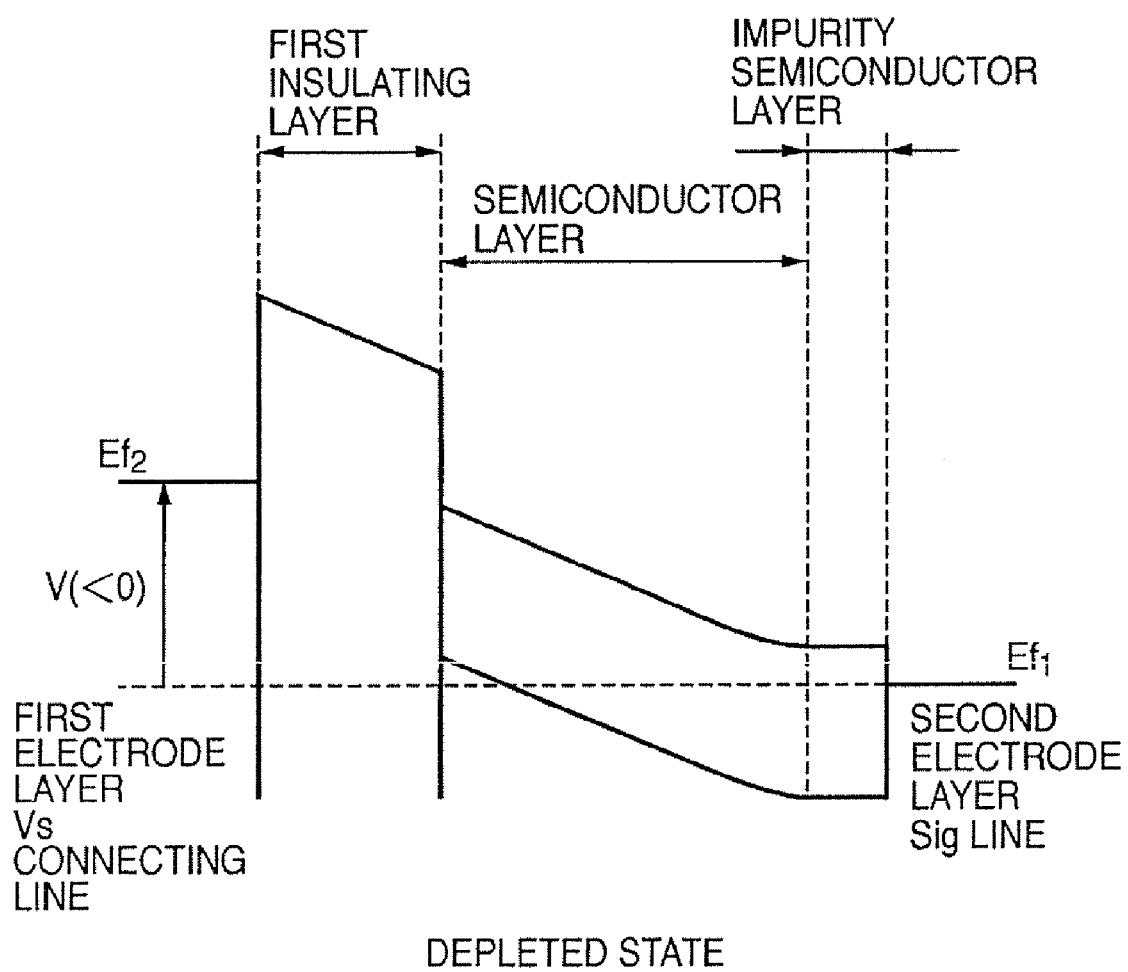
FIG. 18B is another energy band diagram showing the depletion state of the intersection of a conventional radiation imaging apparatus.

On the other hand, at the time of eliminating residual electric charges, the semiconductor layer 1303 of the MIS photoelectric conversion element Pmn enters a conductive state (i.e., the state shown in FIG. 16B). By contrast, the semiconductor layer 1303 of the intersection 1109 enters a depletion state as shown in FIG. 18B.

Unlike liquid crystal displays, the radiation imaging apparatus 1100 digitally converts minute signals and outputs images. In particular, in the case of capturing moving images, the subject is exposed to radiation for a prolonged period, and thus a decrease in the amount of radiation exposure is desired. For this, higher sensitivity of the radiation imaging apparatus 1100 must be achieved. At the same time, as shown in FIG. 18A, if the semiconductor layer 1303 is put in a conductive state at the intersection 1109, only the capacitance formed by the first insulating layer 1302 is loaded onto the Sig line. This capacitance becomes larger compared to the case of forming a capacitance by the depleted semiconductor layer 1303 and the first insulating layer 1302. As a result, noise is increased, leading to sensitivity loss.

In addition, the semiconductor layer 1303 has extremely high resistance, and has a frequency characteristic. Consequently, in order to put the semiconductor layer 1303 into a conductive state, it is necessary to provide bias of a low frequency and of sufficient duration. Here, in considering the Vs line, the line resistance and the parasitic capacitance differs between the X and Y parts in FIG. 11, so the time constant at the time of applying the bias is different. That is, at the X part, which is close to the bias supply apparatus 1108, the desired bias can be supplied in a short period of time. However, at the Y part, which is distant from the bias supply apparatus 1108, a sufficiently long period of time is required to supply the desired bias.

On the other hand, in order to shorten the amount of time from capturing of a still image to its display, or to realize high-speed driving in capturing moving images, the points below must be considered. Specifically, it is necessary, after eliminating the residual electric charges of the conversion element, to change the potential of the Vs line from −5V to 10V in order to start the next capturing, and to then immediately perform photoelectric conversion and signal readout. Consequently, in the substrate at the time of signal readout, there exist a mixture of parts of the a-Si layer which have being put in the conductive state and parts which have not, and the parasitic capacitance formed by the intersection of the Vs line and the Sig line differ. As a result, the S/N ratio at each Sig line in the substrate differs, which may lead to output fluctuation.

On the basis of the above discussion, the present inventors discovered the structure of a radiation imaging apparatus and radiation imaging system which can suppress noise at the intersection 1109. The preferred embodiments of the present invention are characterized by a semiconductor layer which is arranged between the Sig line connected to the switching element and the Vs line, and a carrier blocking portion between the semiconductor layer and the Sig line. An insulating layer can be used as the carrier blocking portion, but the carrier blocking portion is not limited to this. For example, a Schottky barrier may be used instead.

The radiation imaging apparatus and radiation imaging system according to the preferred embodiments of the present invention will be described in detail below with reference to the drawings.

First Embodiment

Figure 1:
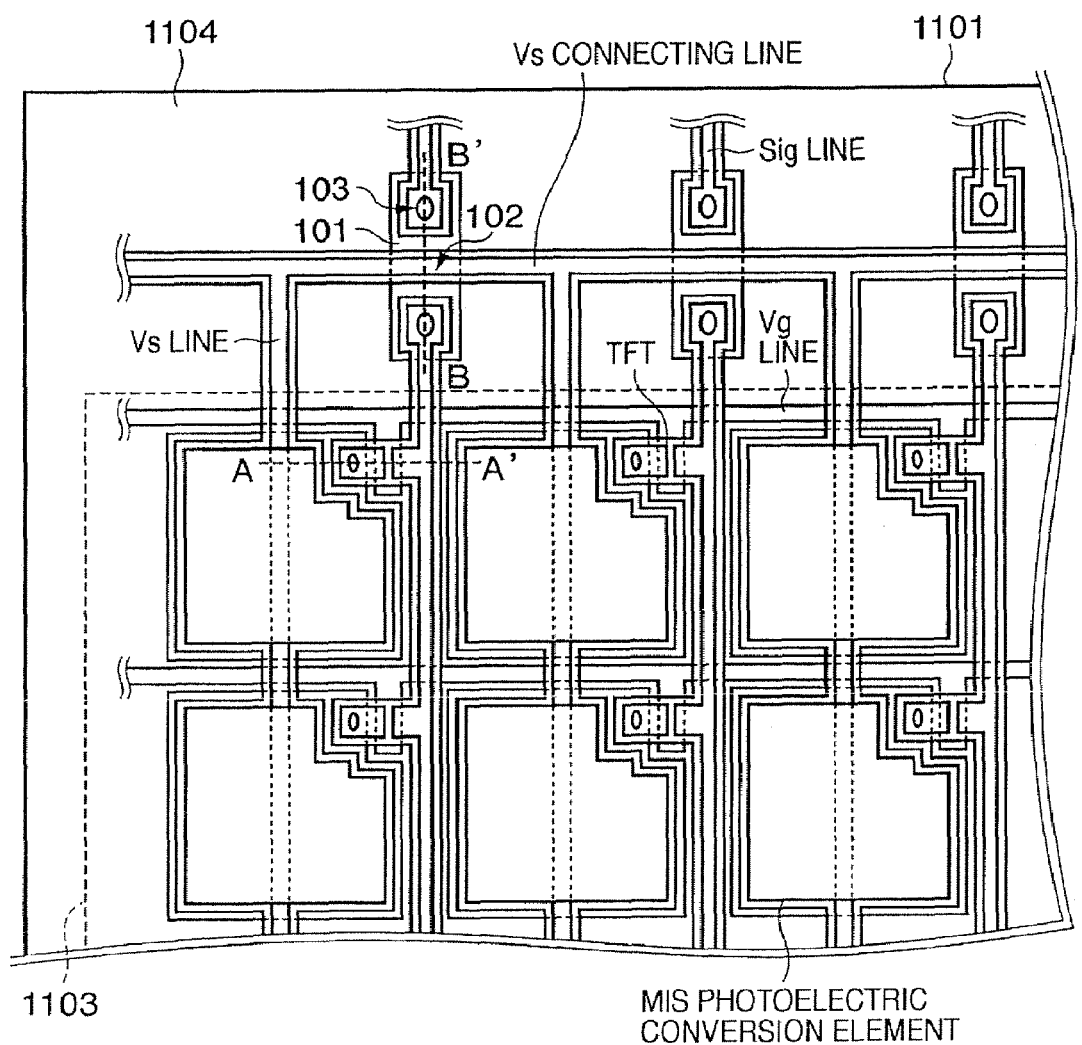
FIG. 1 is a plan view showing a radiation imaging apparatus according to a preferred first embodiment of the present invention.
Figure 2:
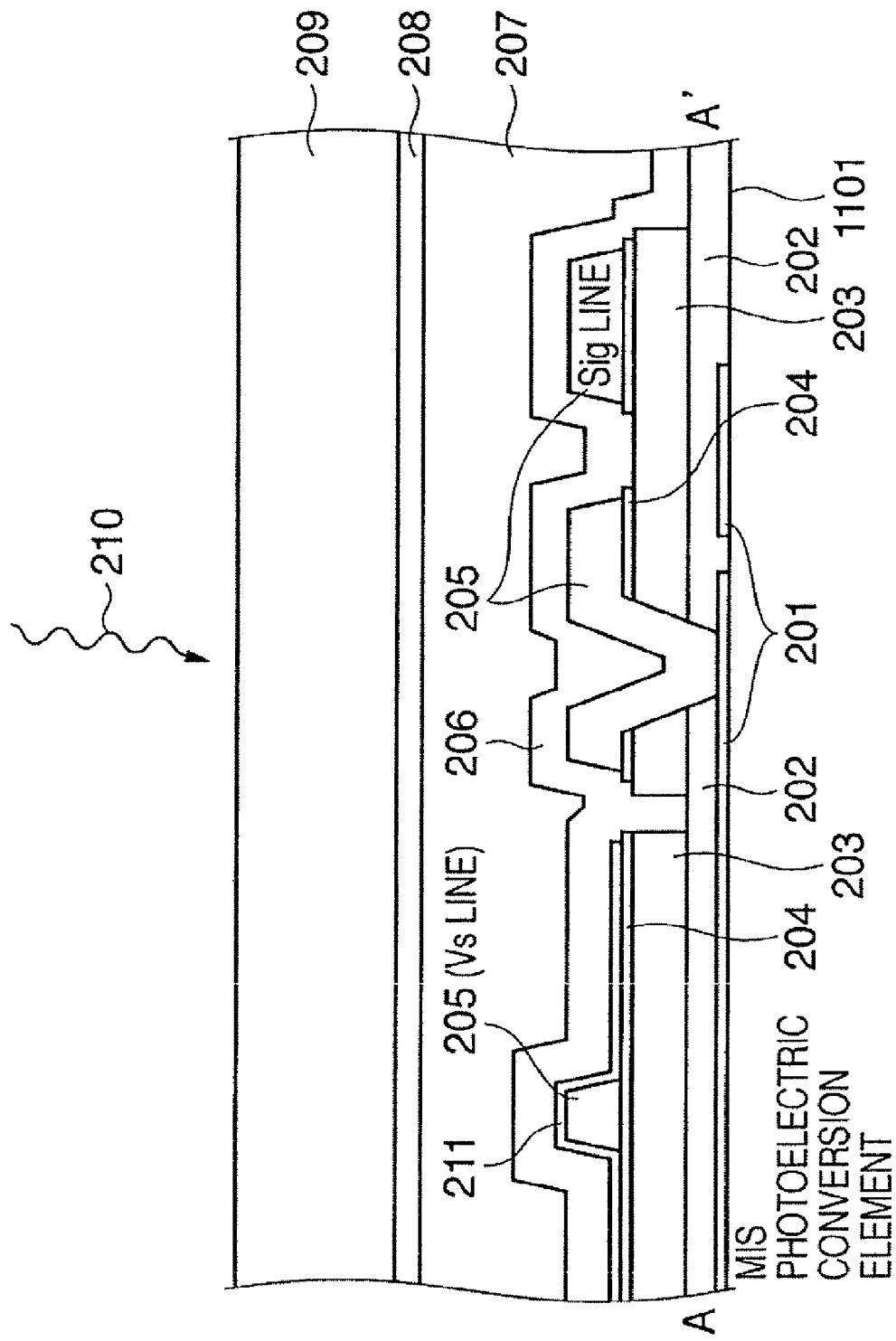
FIG. 2 is a sectional view of FIG. 1A-A' showing the radiation imaging apparatus according to the preferred first embodiment of the present invention.
Figure 3:
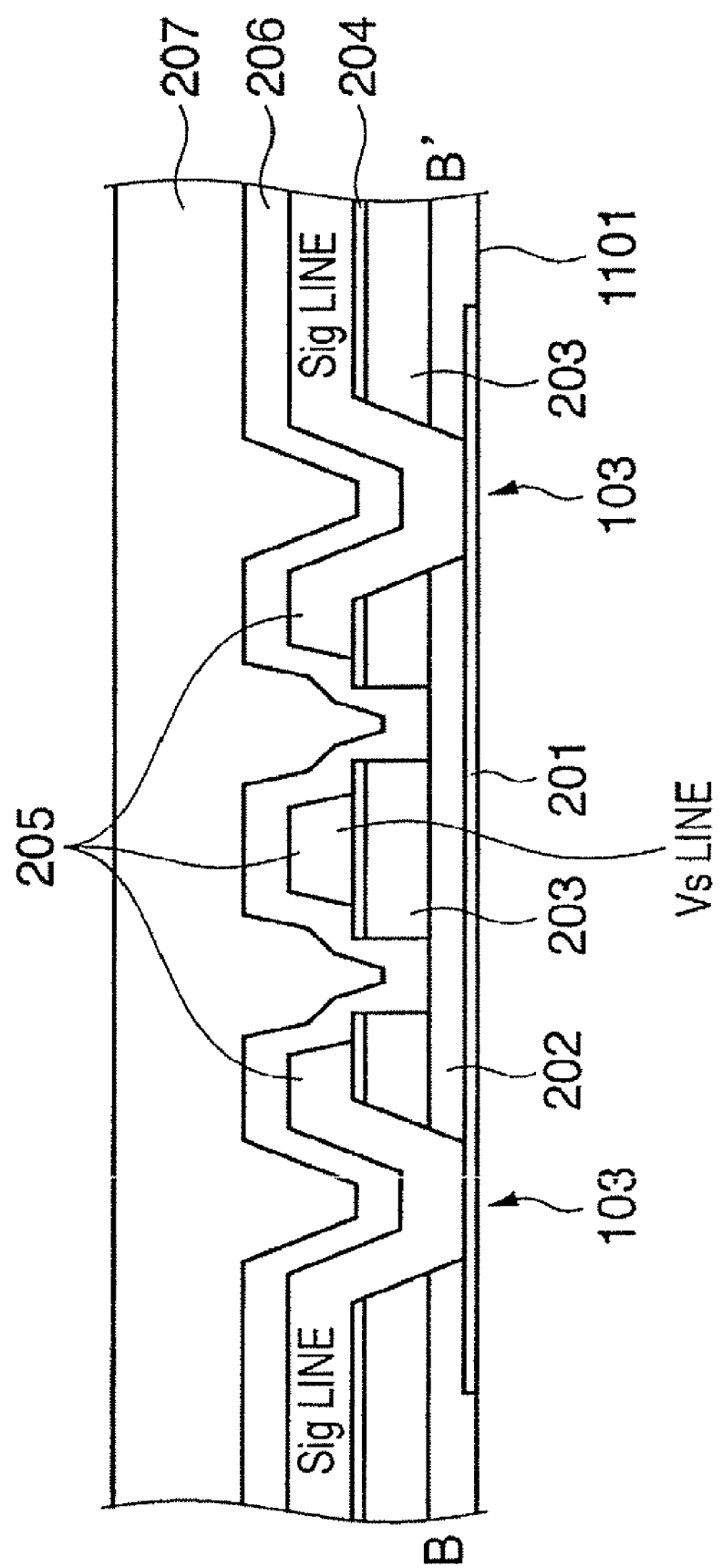
FIG. 3 is a sectional view of FIG. 1B-B' showing the radiation imaging apparatus according to the preferred first embodiment of the present invention.

FIG. 1 is a plan view of the radiation imaging apparatus according to a preferred embodiment of the present invention. FIG. 2 is a sectional view of the dashed line A-A' of one pixel shown in FIG. 1. FIG. 3 is a sectional view of the dashed line B-B' of an intersection 102 of the Sig connection hole 103, the Vs line, and the Sig line. In addition, although FIG. 1 shows pixels of 3 columns×2 rows, the number of pixels is not limited to this.

The radiation imaging apparatus according to the present embodiment uses an MIS photoelectric conversion element as a conversion element, and is an indirect-type radiation imaging apparatus which has a scintillator located at the upper part for converting radiation into visible light. The equivalent circuit diagram and operation principles of the radiation imaging apparatus according to the present embodiment are similar to those for the radiation imaging apparatus shown in FIG. 11 and FIG. 12, so their description will be omitted here.

The layer structure of the radiation imaging apparatus according to the present embodiment will be described with reference to FIG. 2 and FIG. 3. As shown in FIG. 2, the MIS photoelectric conversion element comprises a first electrode layer 201, a first insulating layer 202, a semiconductor layer 203 which is a photoelectric conversion layer, an impurity semiconductor layer 204, a second electrode layer 205 forming a Vs line, and a third electrode layer 211. The semiconductor layer 203 is, for example, formed by an a-Si layer. The third electrode layer 211 forms an electrode for applying a bias supplied from the Vs line to the entire MIS photoelectric conversion element. In addition, the switching element comprises the first electrode layer 201 forming the gate electrode and the Vg line, the first insulating layer 202, the semiconductor layer 203, the impurity semiconductor layer 204, and the second electrode layer 205 forming the source or drain electrode and the Sig line. Further, at the upper layer of the MIS photoelectric conversion element and the switching element, there is successively formed a second insulating layer 206, a protective layer 207, an adhesive layer 208, and a scintillator layer 209 which performs wavelength conversion of radiation to visible light. Thus, by forming the MIS photoelectric conversion element and the switching element in the same layer, the manufacturing process is simplified.

In addition, as shown in FIG. 1 and FIG. 2, each Vs line formed by the second electrode layer 205 is connected to the Vs connection line formed by the second electrode layer 205, and is made common.

A feature of the present embodiment is that, as shown in FIG. 3, the intersection 102 between the Vs line and the Sig line comprises the first electrode layer 201 which is the Sig connection line 101, the first insulating layer 202, the semiconductor layer 203, the impurity semiconductor layer 204, and the second electrode layer 205 which is the Vs line. Here, an a-Si layer, for example, forms the semiconductor layer 203. In addition, the Sig line formed by the second electrode layer 205 is connected, near the intersection 102 with the Vs line, to a Sig connection line 101 via the Sig connection hole 103. Consequently, at the intersection 102, the Sig line is formed by the first electrode layer 201.

The energy-band diagram at the intersection 102 between the Vs line and the Sig line will be described using FIG. 16A and FIG. 16B. Here, as an example, the impurity semiconductor layer will be considered to be an n-type semiconductor layer.

As shown in FIG. 16A, under consideration is the case in which, in the MIS photoelectric conversion element, a positive potential relative to the first electrode layer (Sig connection line) is provided to the second electrode layer (the Vs line), and the Fermi level $Ef_2$ of the second electrode layer becomes lower than the Fermi level $Ef_1$ of the first electrode layer. In this case, the electrons in the second electrode layer are not injected into the semiconductor layer. In addition, as the impurity semiconductor layer is n-type, the hole will not be injected into the semiconductor layer. Therefore, neither electrons nor holes exist in the semiconductor layer, and the semiconductor layer is put in a depletion state.

By contrast, as shown in FIG. 16B, under consideration is the case in which, in the MIS photoelectric conversion element, a negative potential with respect to the first electrode layer (Sig connection line) is provided to the second electrode layer (Vs line), and the Fermi level $Ef_2$ of the second electrode layer becomes higher than the Fermi level $Ef_1$ of the first electrode layer. In this case, electrons are injected from the second electrode layer into the semiconductor layer. In this way, the semiconductor layer is filled with electrons and is put in a conductive state.

Therefore, consider the case in which, for example, a reference potential (GND) is provided to the Sig line, and a potential (e.g., 10V) higher than the reference potential is provided to the Vs line, thereby putting the MIS photoelectric conversion element into a depletion state, as shown in FIG. 16A. Here, as is the case for the intersection 102 of the Vs line and the Sig line, the semiconductor layer 203 is put in a depletion state, as shown in FIG. 16A. Through this, the capacitance loaded onto the Sig line at the intersection 102 becomes the composite capacitance of the capacitances of the first insulating layer 202 and the semiconductor layer 203, and becomes smaller compared to the case of putting the semiconductor layer 203 in a conductive state. Consequently, noise is decreased.

On the other hand, as shown in FIG. 16B, in the MIS photoelectric conversion element, for example, the residual electric charges (in this case, the hole) of the photoelectric conversion element are eliminated by lowering the potential (e.g., −5V) to below the reference potential of the Vs line. Then, consider the case of, as shown in FIG. 16A, subsequently changing the electric potential of the Vs line to a value (10V) higher than the reference potential, and immediately performing photoelectric conversion and signal readout. Here, at the time of signal readout, an equivalent parasitic capacitance is added to any part of the Sig line.

Second Embodiment

Figure 4:
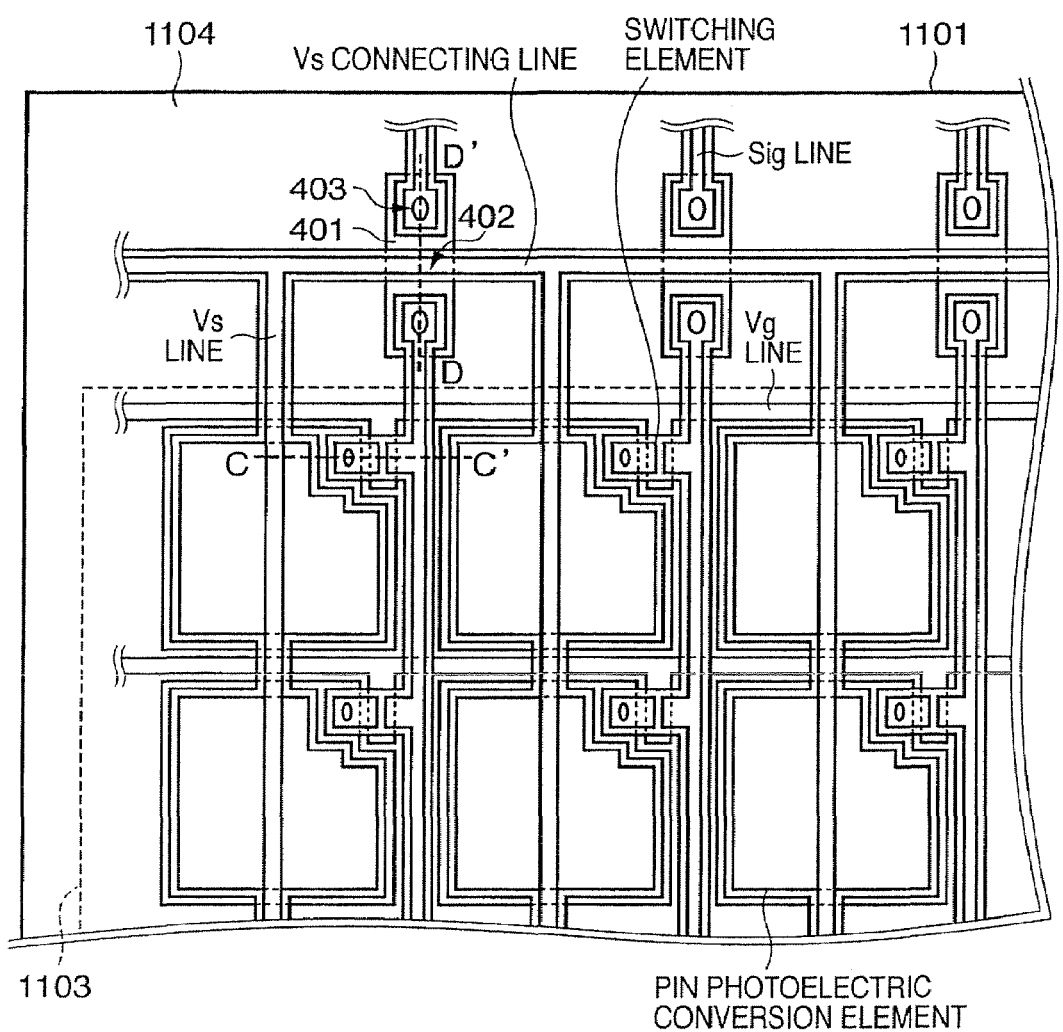
FIG. 4 is a plan view showing the radiation imaging apparatus according to a preferred second embodiment of the present invention.
Figure 5:
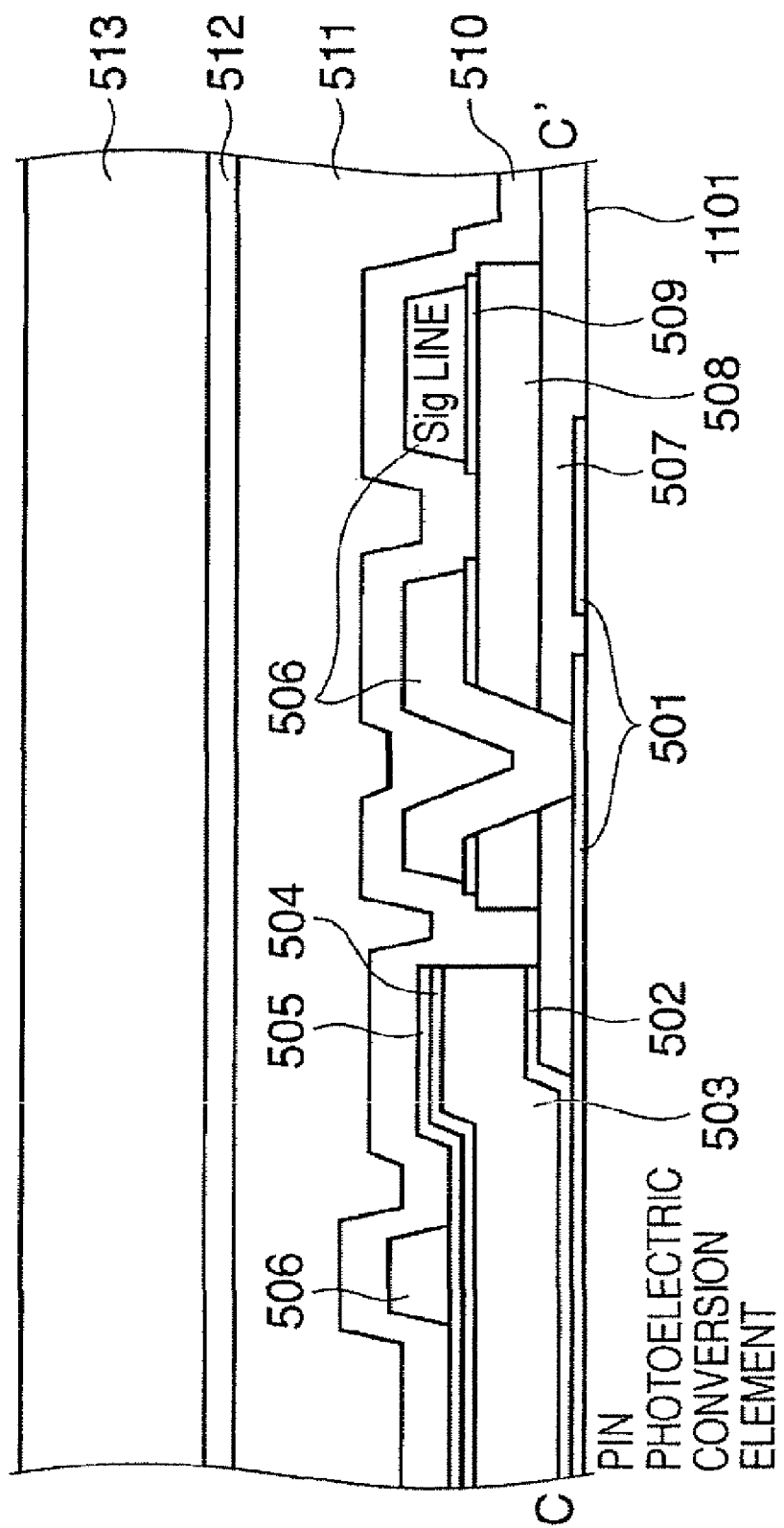
FIG. 5 is a sectional view of FIG. 4 C-C' showing the radiation imaging apparatus according to a preferred second embodiment of the present invention.
Figure 6:
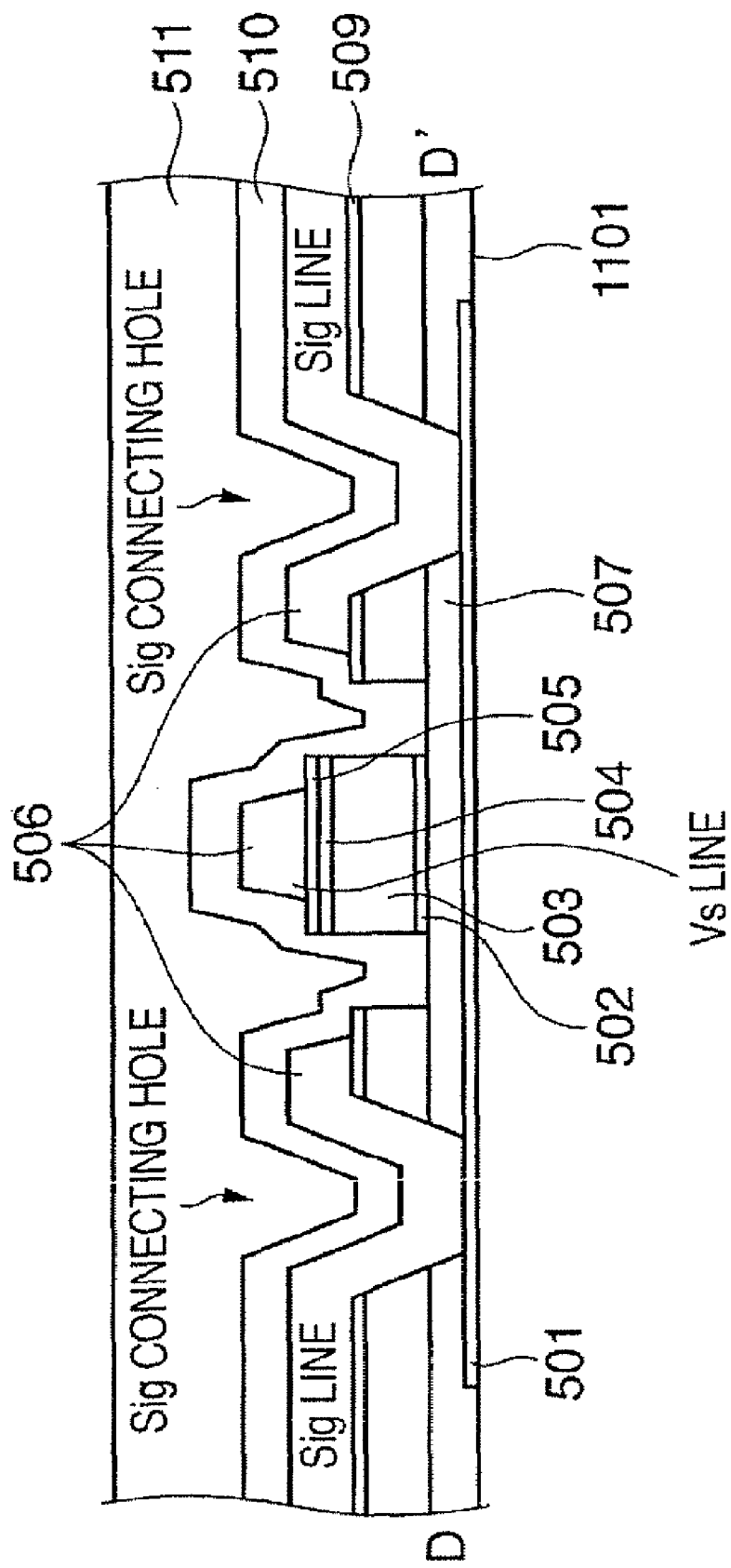
FIG. 6 is a sectional view of FIG. 4 D-D' showing the radiation imaging apparatus according to the preferred second embodiment of the present invention.

FIG. 4 is a plan view of the radiation imaging apparatus according to a preferred embodiment of the present invention. FIG. 5 is a sectional view of the dashed line C-C' of one pixel shown in FIG. 4. FIG. 6 is a sectional view of the dashed line D-D' of an intersection 402 of the following components of FIG. 4: a Sig connection hole 403, the Vs line and the Sig line. In addition, FIG. 4 shows a pixel of 3 columns×2 rows, but the pixel number is not restricted to this.

The radiation imaging apparatus according to the present embodiment uses a PIN photoelectric conversion element as a conversion element, and is an indirect-type radiation imaging apparatus which has, at the top part, a scintillator which converts radiation into visible light. The equivalent circuit diagram of the radiation imaging apparatus according to the present embodiment is similar to the radiation imaging apparatus shown in FIG. 11, and therefore its description will be omitted.

Figure 19A:
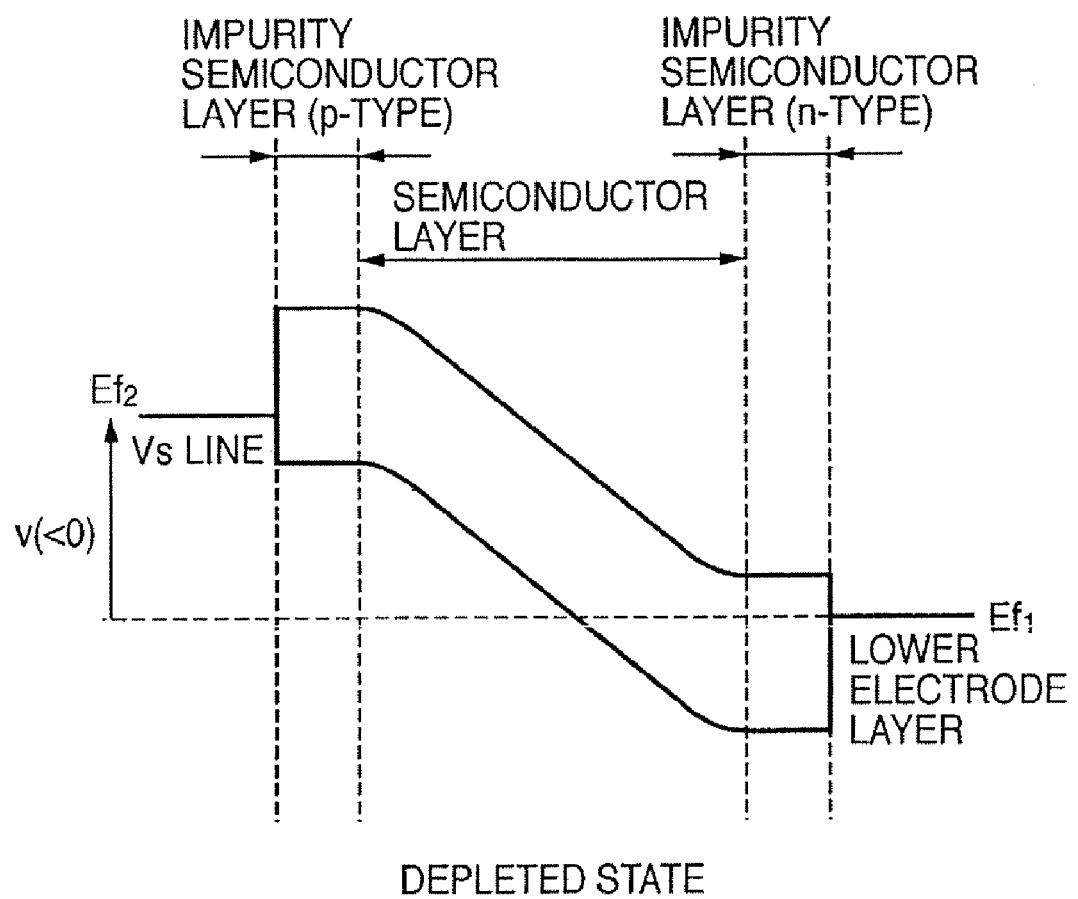
FIG. 19A is a diagram showing an energy band diagram explaining the depletion state of the radiation imaging apparatus according to the preferred second and third embodiments of the present invention.
Figure 19B:
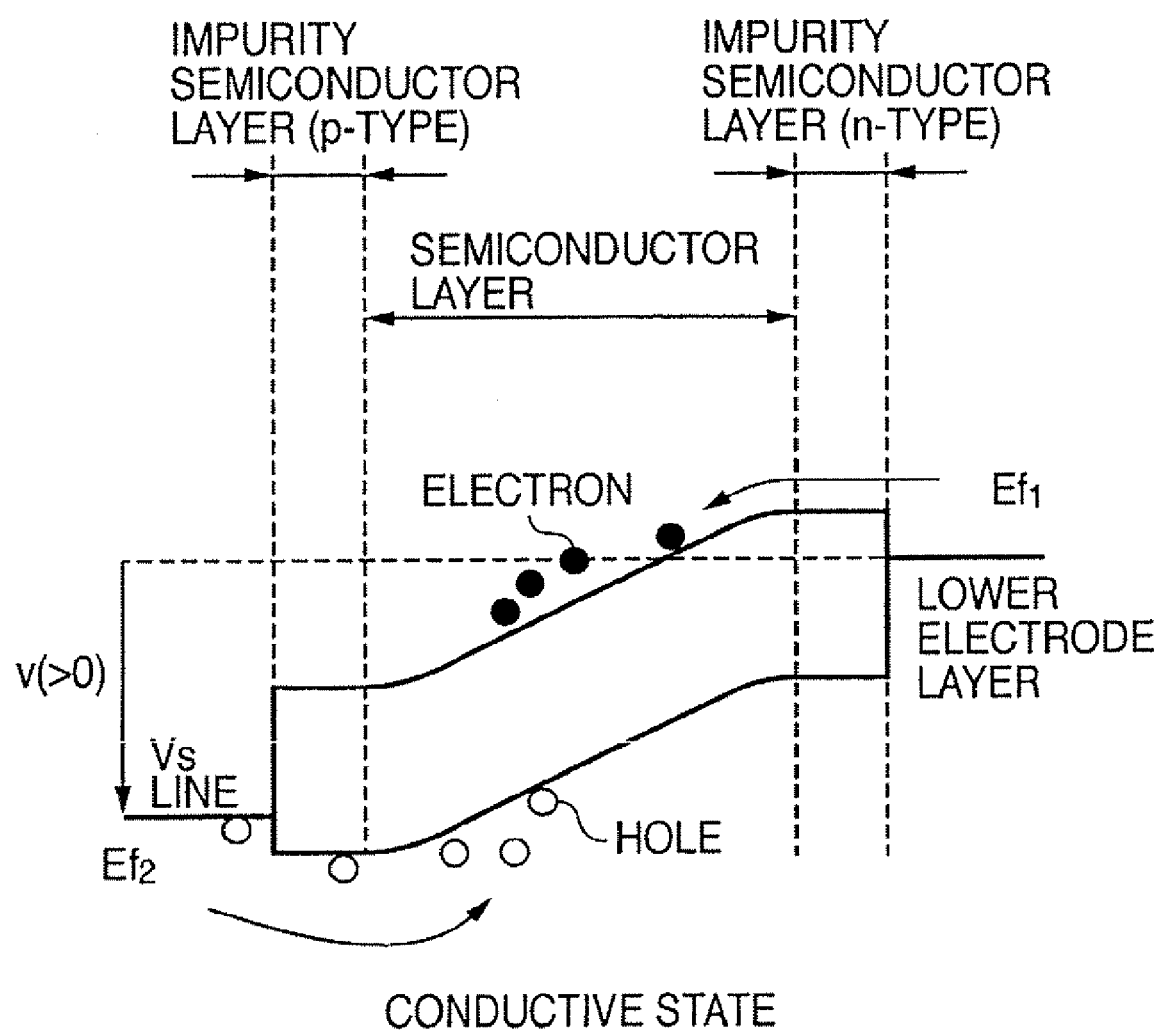
FIG. 19B is a diagram showing an energy band diagram explaining the conductive state of the radiation imaging apparatus according to the preferred second and third embodiments of the present invention.

The operation principles of the radiation imaging apparatus according to the present embodiment will be described with reference to FIG. 19A and FIG. 19B. First, as shown in FIG. 19A, bias is provided to the Vs line so that the photoelectric conversion layer (semiconductor layer) of the PIN photoelectric conversion element is put in a depletion state. For example, the reference potential (GND) is provided to the lower electrode of the PIN photoelectric conversion element, and a potential (e.g., −10V) lower than the reference potential is provided to the Vs line. In this state, radiation directed towards the subject is transmitted through the subject while undergoing decay. Radiation transmitted through the subject is converted into visible light in the scintillator layer. This visible light is injected into the photoelectric conversion element and converted into electric charges. At this time, the potential of the lower electrode of the PIN photoelectric conversion element changes in response to generated electric charges. Following this, these electric charges are transferred to the Sig line via the switching element by the gate driving pulse which is applied to the Vg line from the gate driving apparatus 1106, and is read out externally by the readout apparatus 1107. Similarly, where the PIN photoelectric conversion element is concerned, elimination of residual charges is performed as needed, immediately before start of capturing or at each instance of capturing. In this case, as shown in FIG. 19B, for example, the potential of the Vs line is changed to a potential (e.g., 5V) higher than the reference potential. When capturing moving images, as shown in FIG. 19A, the potential of the Vs line is further returned to a potential (e.g., −10V) lower than the reference potential, and the above operation is repeated.

Next, the layer structure of the radiation imaging apparatus 1100 shown in FIG. 5 and FIG. 6 will be described. As shown in FIG. 5, the PIN photoelectric conversion element comprises a first electrode layer 501, a first impurity semiconductor layer 502, a first semiconductor layer 503, a second impurity semiconductor layer 504, a second electrode layer 505, and a third electrode layer 506 forming the Vs line. The first impurity semiconductor layer 502 is, for example, formed by an n-type semiconductor. In addition, the second impurity semiconductor layer 504 is, for example, formed by the p-type semiconductor. The second electrode layer 505 forms an electrode for applying a bias supplied from the Vs line to the entire PIN photoelectric conversion element. In addition, the switching element comprises the first electrode layer 501 forming the gate electrode and the Vg line, a first insulating layer 507, a second semiconductor layer 508, a third impurity semiconductor layer 509, and the third electrode layer 506 forming the source or drain electrode and the Sig line. The second semiconductor layer 508 is, for example, formed by the a-Si layer. The third impurity semiconductor layer 509 is, for example, formed by an n-type semiconductor.

Further, successively formed at the upper layer of the PIN photoelectric conversion element and the switching element are a second insulating layer 510, a protective layer 511, an adhesive layer 512, and a scintillator layer 513 which performs wavelength conversion of radiation to visible light.

In addition, as shown in FIG. 4 and FIG. 5, each Vs line formed by the third electrode layer 506 is connected to the Vs connection line formed by the same third electrode layer 506.

A feature of the present embodiment is that the intersection 402 of the Vs line and the Sig line is structured as shown in FIG. 6. That is, the intersection 402 comprises the first electrode layer 501, the first insulating layer 507, the first impurity semiconductor layer 502, the first semiconductor layer 503, the second impurity semiconductor layer 504, the second electrode layer 505, and the third electrode layer 506. Here, the first semiconductor layer 503 is, for example, formed by an a-Si layer. In addition, a Sig connection line 401 is formed by the first electrode layer 501, and, moreover, the Vs line is formed by the third electrode layer 506. Also, the Sig line formed by the third electrode layer 506 is, in the vicinity of the intersection 402 with the Vs line, connected to the Sig connection line 401 via the Sig connection hole 403. Therefore, the Sig line is formed by the first electrode layer 501 at the intersection 402.

Figure 17A:
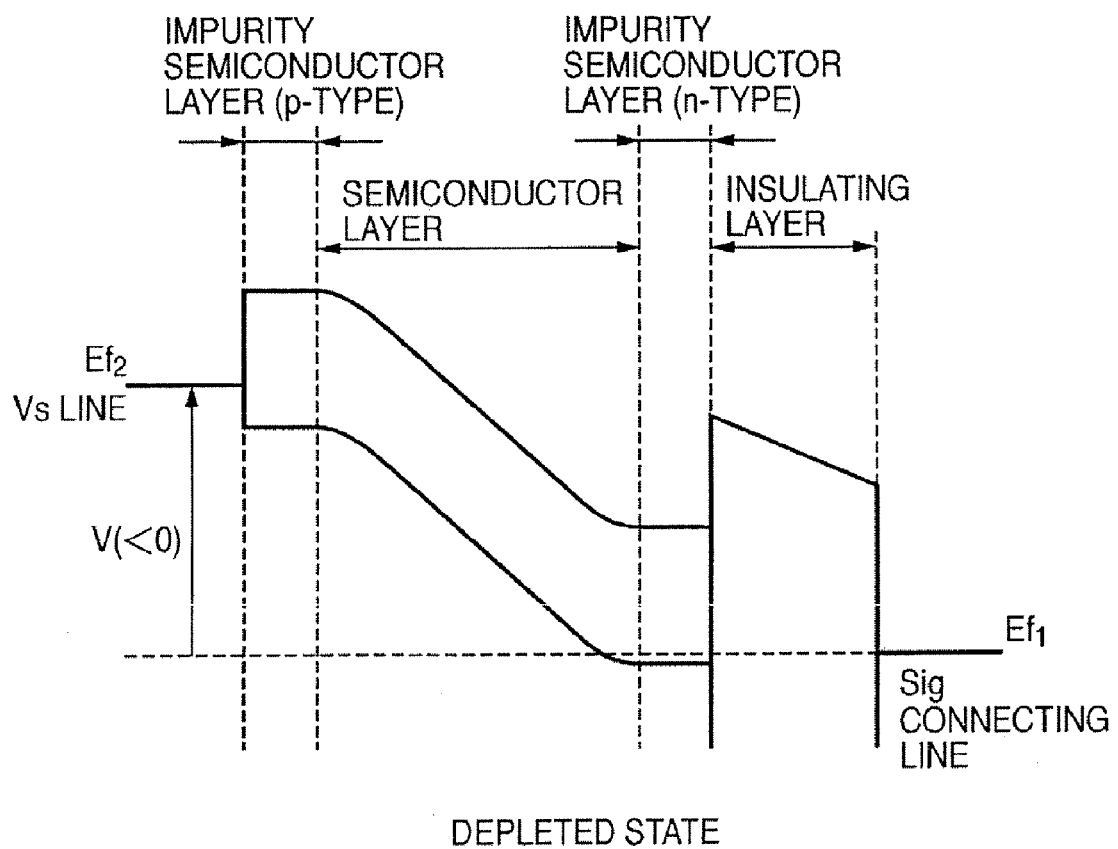
FIG. 17A is a diagram showing an energy band diagram explaining the depletion state according to the intersection of the radiation imaging apparatus according to the second and third embodiment of the present invention.
Figure 17B:
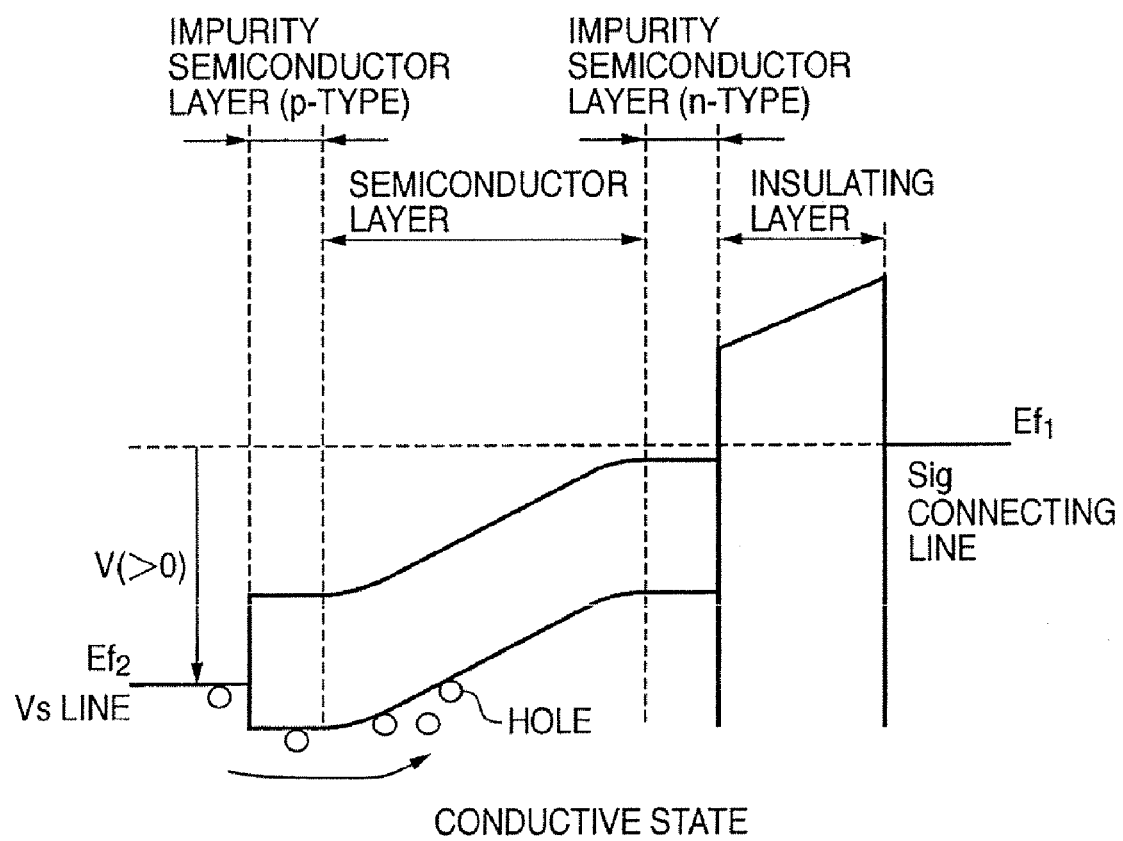
FIG. 17B is a diagram showing an energy band diagram explaining the conductive state of the intersection of the radiation imaging apparatus according to the preferred second and third embodiments of the present invention.

In the above structure, as shown in FIG. 19A, suppose that, in the PIN photoelectric conversion element, the lower electrode is provided the reference potential (GND), and the Vs line is provided a potential (e.g., −10V) lower than the reference potential. Here, as is the case with the intersection 402 of the Vs connection line and the Sig line, the first semiconductor layer 503 is put in the depletion state as shown in FIG. 17A. By this, the capacitance loaded onto the Sig line at the intersection 402 becomes the composite capacitance of the capacitances of the first insulation layer 507 and the first semiconductor layer 503, and becomes smaller compared to when treating the first semiconductor layer as being in the conductive state. As a result, noise becomes less.

In addition, consider, as shown in FIG. 19A, the case of, after changing the potential of the Vs line to a value (e.g., −10V) lower than the reference potential and performing photoelectric conversion by the photoelectric conversion element, for example changing, as shown in FIG. 19B, the potential to a value (e.g., 5V) higher than the potential of the Vs line, and eliminating the electric charges (here, electrons) remaining in the photoelectric conversion element. Here, after eliminating residual electric charges, as shown in FIG. 17A, if the potential of the Vs line is changed from 5V to −10V, and photoelectric conversion and signal readout is performed immediately, an equivalent parasitic capacitance is added to any part of the Sig line at the time of signal readout.

Third Embodiment

Figure 7:
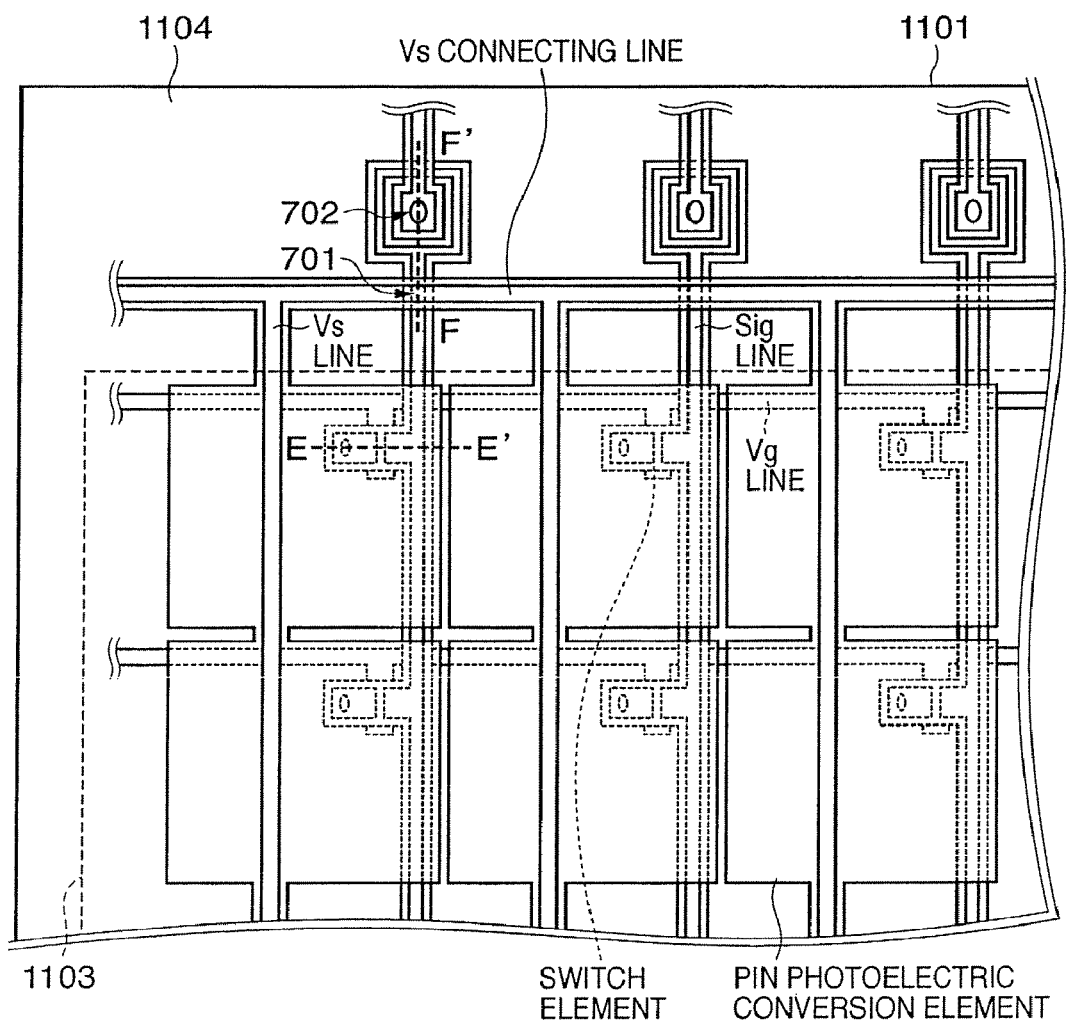
FIG. 7 is a plan view showing the radiation imaging apparatus according to a preferred third embodiment of the present invention.
Figure 8:
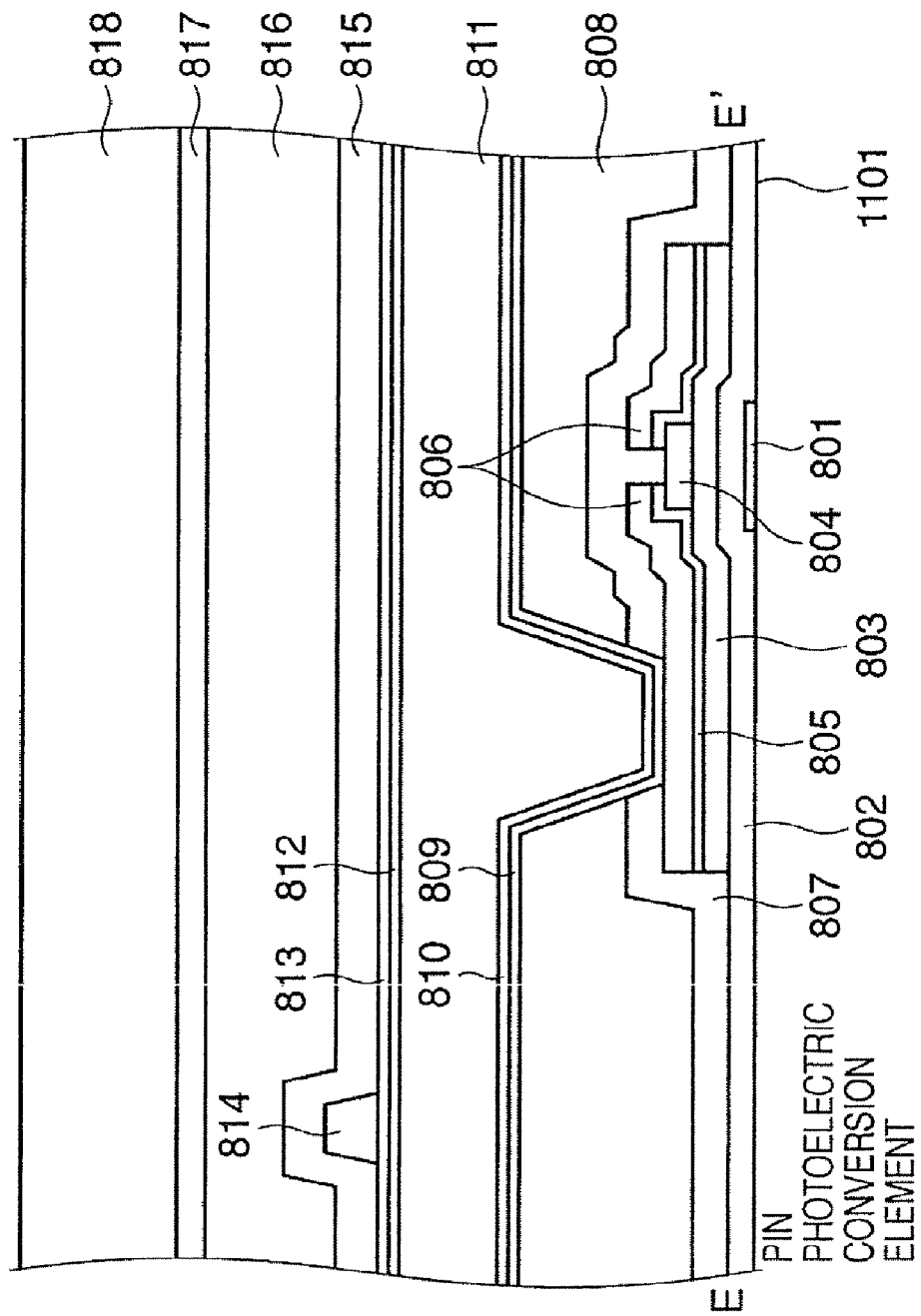
FIG. 8 is a sectional view of FIG. 7 E-E' showing the radiation imaging apparatus according to the preferred third embodiment of the present invention.
Figure 9:
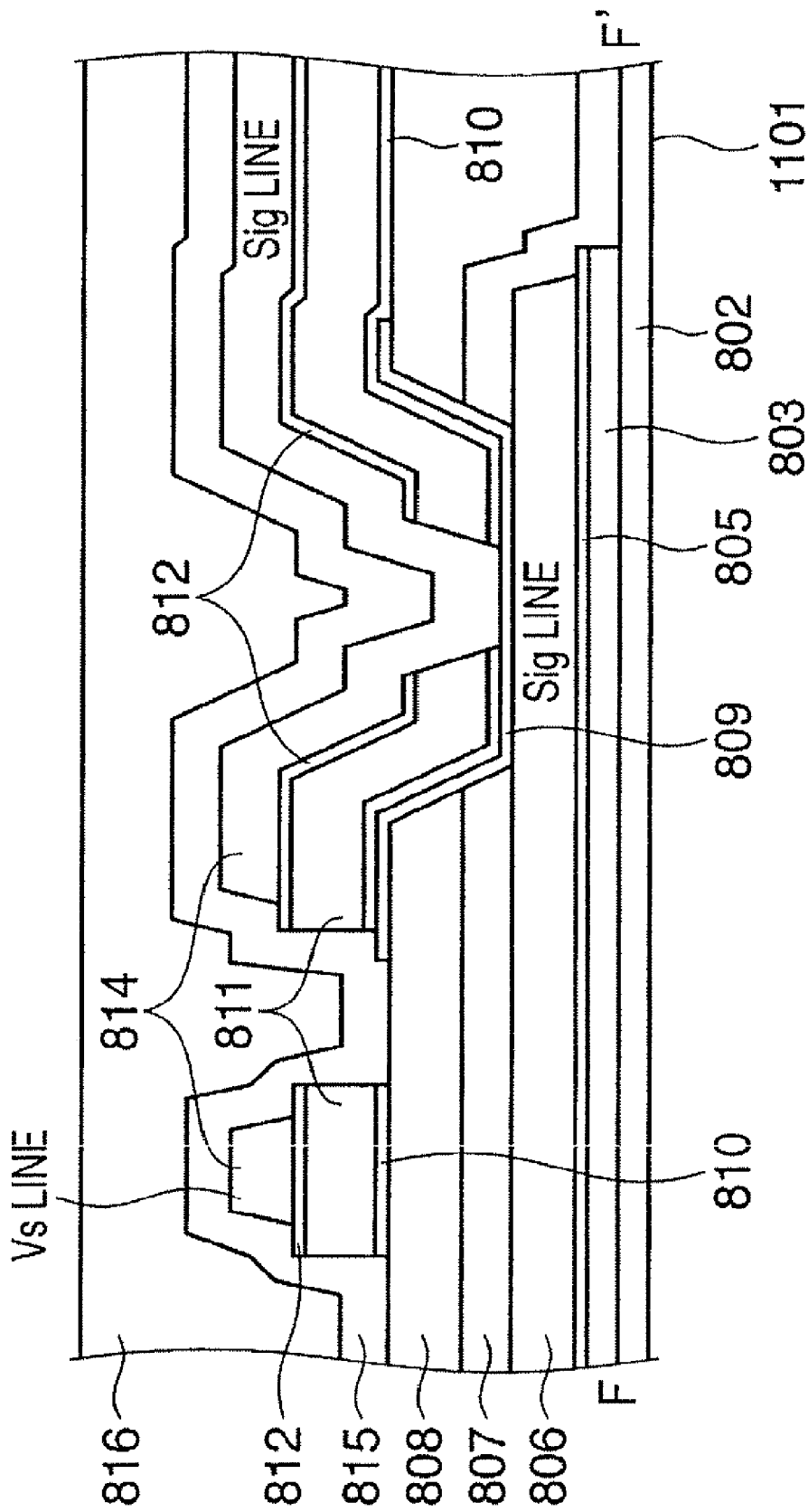
FIG. 9 is a sectional view of FIG. 7 F-F' showing the radiation imaging apparatus according to the preferred third embodiment of the present invention.

FIG. 7 is a plan view of the radiation imaging apparatus according to a preferred embodiment of the present invention. FIG. 8 is a sectional view of the dashed line E-E' of one pixel shown in FIG. 7. FIG. 9 is a sectional view of the dashed line F-F' of the intersection 701 of the Sig connection hole 702, the Vs line and the Sig line shown in FIG. 7. In addition, FIG. 1 shows pixels of 3 columns×2 rows, but the pixel number is not limited to this.

The radiation imaging apparatus according to the present embodiment uses a PIN photoelectric conversion element as the conversion element, and is an indirect-type radiation imaging apparatus which has a scintillator in the upper part for converting radiation into visible light. The equivalent circuit diagram of the radiation imaging apparatus according to the present embodiment is similar to that of the radiation imaging apparatus shown in FIG. 11, and, since its operation principles are the same as those of the second embodiment, their description will be omitted here.

The layer structure of the radiation imaging apparatus according to the present embodiment will be described in FIG. 8 and FIG. 9. As shown in FIG. 8, the switching element comprises a first electrode layer 801, a first insulating layer 802, a first semiconductor layer 803, a second insulating layer 804, a first impurity semiconductor layer 805, and a second electrode layer 806. The gate electrode and the Vg line are formed by the first electrode layer 801. In addition, the source or drain electrode and Sig line are formed by the second electrode layer 806.

A PIN photoelectric conversion element is formed in the upper layer of the switching element via a third insulating layer 807 and a fourth insulating layer 808 which is a flattening film. The PIN photoelectric conversion element comprises a third electrode layer 809, a second impurity semiconductor layer 810, a second semiconductor layer 811, a third impurity semiconductor layer 812, a fourth electrode layer 813, and a fifth electrode layer 814 which forms the Vs line. The second impurity semiconductor layer 810 is, for example, formed by an n-type semiconductor. The second semiconductor layer 811 is, for example, formed by an a-Si layer. The third impurity semiconductor layer 812 is, for example, formed by a p-type semiconductor. The fourth electrode layer 813 forms an electrode for applying a bias supplied from the Vs line to the entire PIN photoelectric conversion element. Further, successively formed at the upper layer of the PIN photoelectric conversion element are a fifth insulating layer 815, a protective layer 816, an adhesive layer 817, and a scintillator layer 818 which performs wavelength conversion of radiation to visible light.

In addition, as shown in FIG. 7 and FIG. 8, each Vs line formed by a fifth electrode layer 814 is connected to the Vs connection line formed by the same fifth electrode layer 814, and is made common.

A feature of the present embodiment is that an intersection 701 of the Vs line and the Sig line is structured as shown in FIG. 9. That is, the intersection 701 comprises a first insulating layer 802, a first semiconductor layer 803, a first impurity semiconductor layer 805, a second electrode layer 806, a third insulating layer 807, a fourth insulating layer 808, a second impurity semiconductor layer 810, a second semiconductor layer 811, a third impurity semiconductor layer 812, and a fifth electrode layer 814. The first semiconductor layer 803 and the second semiconductor layer 811 are, for example, formed by an a-Si layer. The Sig line is formed by the second electrode layer 806. The Vs line is formed by the fifth electrode layer 814.

In addition, the Sig line is, with the exception of the intersection 701 with the Vs line, formed by the fifth electrode layer 814, as with the Vs line. The Sig line forms a connection terminal to the peripheral circuitry, which is not shown in the drawings.

With regard to the above structure, consider the case of providing the lower electrode of the PIN photoelectric conversion element with the reference potential (GND), and the Vs line with a potential (e.g., −10V) lower than the reference potential, and putting the PIN photoelectric conversion element in a depletion state, as shown in FIG. 19A. In this case, as with the intersection 701 of the Vs connection line and the Sig line, the second semiconductor layer 811 is put in the depletion state as shown in FIG. 17A. By this, in the intersection 701, the capacitance loaded onto the Sig line becomes the composite capacitance of the capacitances of the third and fourth insulating layers 807 and 808 and the second semiconductor layer 811, and the loaded capacitance becomes smaller compared to when treating the second semiconductor layer 811 as being in the conductive state. As a result, noise is reduced.

Also, when it is necessary to eliminate residual electric charges in the photoelectric conversion element, after eliminating the residual electric charges (here, electrons) as shown in FIG. 19B, the potential of the Vs line is changed to a lower potential (e.g., −10V) than the reference potential, as shown in FIG. 19A. Subsequently, in the case of performing immediately photoelectric conversion and signal readout, the equivalent parasitic capacitance is added at the time of signal readout to any part of the Sig line.

As described above, according to the radiation imaging apparatus according to the preferred first through third embodiments of the present invention, it is possible to reduce noise generated by lowering the capacitance of the intersection structured by the Vs line (Vs connection line) and the Sig line. Consequently, for example, it is possible to prevent variability in output when reducing high sensitivity loss, shortening capturing time or implementing high speed driving.

Exemplary Applications

Figure 10:
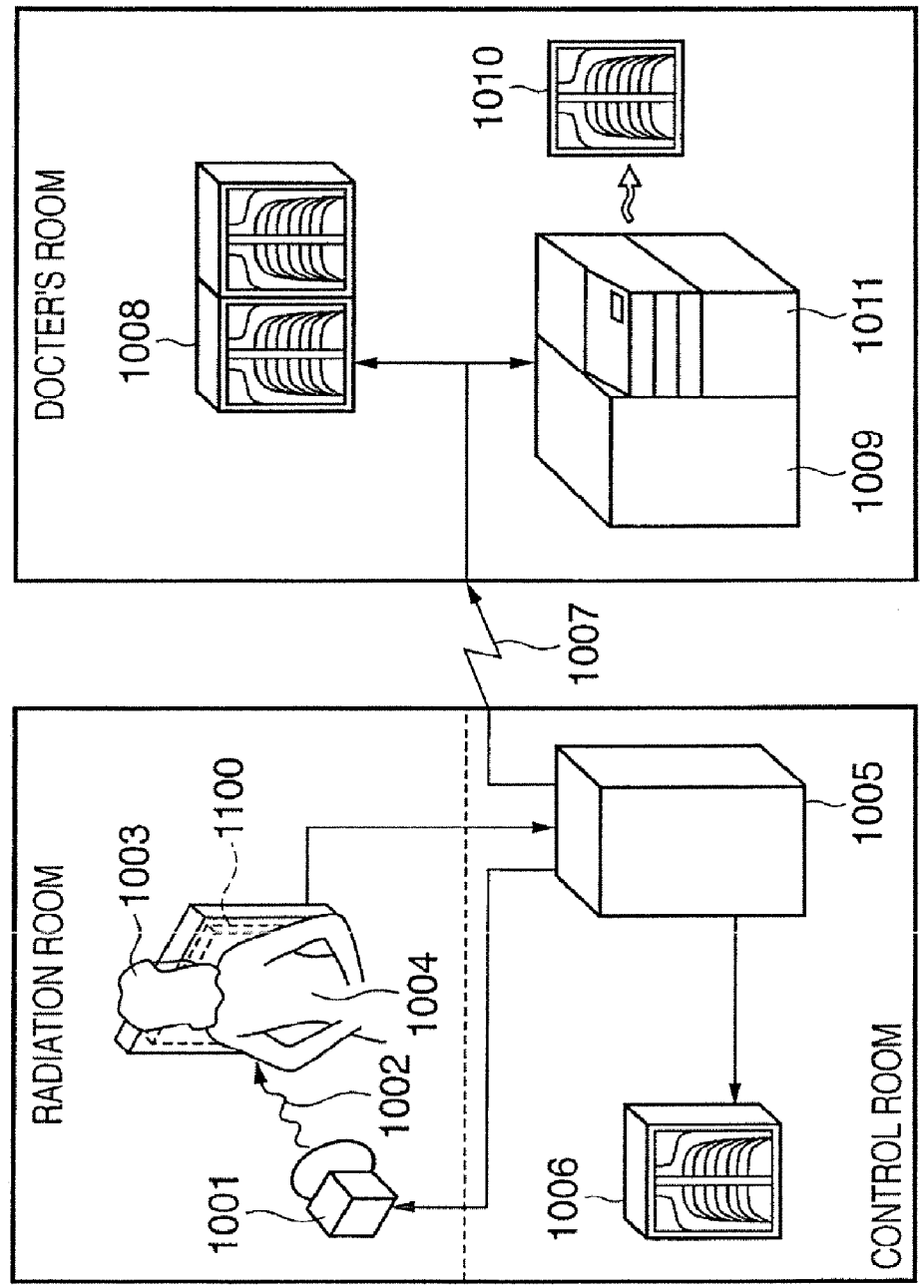
FIG. 10 is a schematic view showing an exemplary application of the preferred radiation imaging apparatus to a radiation diagnostic system according to the present invention.

FIG. 10 is a diagram showing an example of the application of the radiation imaging apparatus according to the preferred embodiments of the present invention to a radiographic diagnosis system.

A radiation 1002 generated by a radiation tube 1001 is transmitted through a body part 1004 such as the chest of a subject 1003 (e.g., patient), and is injected into the radiation imaging apparatus 1100 equipped at the top part with a scintillator (phosphor). This injected radiation 1002 contains information about the body part of the subject 1003. In the radiation imaging apparatus 1100, the scintillator emits light in response to the injection of the radiation 1002, and electrical information is obtained by photoelectric conversion of this light. In addition, in the radiation imaging apparatus 1100, the radiation 1002 may be directly converted into electric charges and thereby electric information may be obtained. This information is converted into digital, image processed by an image processor 1005 which is a signal-processing unit, and displayed on a display 1006, which is a display unit in the control room.

In addition, this information may be transferred to a distant location by a wireless or wired (e.g., telephone line) transmission unit 1007. In this way, it is possible to display the information on a display 1008, a display unit set up at a different location such as in a different doctor's room. Alternatively, it is possible to store the information in a storage medium such as an optical disk through a film processor 1009, which serves as a storage unit. In this manner, it is possible for a physician at a distant location to carry out diagnosis. In addition, the film processor 1009 can be connected to a laser printer, a printing unit, and the information transmitted by a transmission unit 1007 can be stored in a storage medium such as a film.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-144683, filed May 24, 2006, and No. 2007-099751, filed Apr. 5, 2007, which are hereby incorporated by reference herein in their entirety.

What is claimed is:

1. A radiation imaging apparatus comprising:
   a pixel region, on a substrate, including a plurality of pixels arranged in a matrix, each pixel having a conversion element that converts radiation into electric charges and a switching element connected to the conversion element therein; and
   an intersection of a first line connected to the switching element and a second line connected to the conversion element, the intersection being arranged outside the pixel region,
   wherein the intersection includes a semiconductor layer arranged between the first line and the second line, and includes a carrier blocking portion arranged between the semiconductor layer and the first line, and includes an electrode layer arranged between the second line and the semiconductor layer.

2. A radiation imaging apparatus according to claim 1, wherein the first line is arranged between the substrate and the second line.

3. A radiation imaging apparatus according to claim 1, further comprising a first impurity semiconductor layer arranged between the second line and the semiconductor layer.

4. A radiation imaging apparatus according to claim 1, further comprising a second impurity semiconductor layer arranged between the carrier blocking portion and the semiconductor layer, wherein the second impurity semiconductor layer is an n-type semiconductor layer.

5. A radiation imaging system comprising:
   a radiation imaging apparatus as defined in claim 1; and
   a signal-processing unit configured to process a signal from the radiation imaging apparatus.

6. A radiation imaging apparatus, comprising:
   a pixel region, on a substrate, including a plurality of pixels arranged in a matrix, each pixel having a conversion element that converts radiation into electric charges and a switching element connected to the conversion element therein; and
   an intersection of a first line connected to the switching element and a second line connected to the conversion element, the intersection being arranged outside the pixel region,
   wherein the intersection includes a semiconductor layer arranged between the first line and the second line, and includes a carrier blocking portion arranged between the semiconductor layer and the first line, and
   wherein the carrier blocking portion includes a first insulating layer and a second insulating layer.

7. A radiation imaging apparatus according to claim 1, wherein a Fermi level of the first line is lower than that of the second line when the conversion element converts radiation into electric charges.

8. A radiation imaging apparatus according to claim 7, wherein a first voltage is applied to the first line, and a second voltage lower than the first voltage is applied to the second line when the converter converts radiation into electric charges.

9. A radiation imaging system comprising:
   a radiation imaging apparatus as defined in claim 6; and
   a signal-processing unit configured to process a signal from the radiation imaging apparatus.

10. A radiation imaging apparatus according to claim 6, wherein the first line is arranged between the substrate and the second line.

11. A radiation imaging apparatus according to claim 6, further comprising a first impurity semiconductor layer arranged between the second line and the semiconductor layer.

12. A radiation imaging apparatus according to claim 6, further comprising a second impurity semiconductor layer arranged between the carrier blocking portion and the semiconductor layer,
   wherein the second impurity semiconductor layer is an n-type semiconductor layer.

13. A radiation imaging apparatus according to claim 6, wherein a Fermi level of the first line is lower than that of the second line when the conversion element converts radiation into electric charges.

14. A radiation imaging apparatus according to claim 13, wherein a first voltage is applied to the first line, and a second voltage lower than the first voltage is applied to the second line when the converter converts radiation into electric charges.

* * * * *